United States Patent [19]
Endo et al.

[11] Patent Number: 5,479,136
[45] Date of Patent: Dec. 26, 1995

[54] AFC CIRCUIT HAVING LOCAL OSCILLATOR PHASE LOCKED LOOP

[75] Inventors: Yoichi Endo, Kawasaki; Yutaka Oda, Sapporo, both of Japan

[73] Assignee: Fujitsu Limited, Kawasaki, Japan

[21] Appl. No.: 325,162

[22] Filed: Oct. 21, 1994

[30] Foreign Application Priority Data

May 16, 1994 [JP] Japan .................................. 6-101096

[51] Int. Cl.$^6$ ............................ H03L 7/085; H03L 7/185
[52] U.S. Cl. ................... 331/2; 331/10; 331/16; 331/17; 331/25; 375/376; 455/260
[58] Field of Search .................................. 331/2, 10, 16, 331/17, 25; 375/376; 455/260

[56] References Cited

U.S. PATENT DOCUMENTS 4,811,424  3/1989  Cox ........................................ 455/260
5,115,515  5/1992  Yamamoto et al. ..................... 455/260

*Primary Examiner*—Siegfried H. Grimm
*Attorney, Agent, or Firm*—Armstrong, Westerman, Hattori, McLeland & Naughton

[57]  ABSTRACT

An automatic frequency control circuit which can set a local oscillator synthesizer to a small frequency division number, without requesting the exact required frequency. The automatic frequency control circuit includes a voltage source for producing a desired voltage to offset the oscillation frequency of a voltage controlled oscillator, and an adder for adding the output from the voltage source to a frequency control signal of the voltage controlled oscillator. The automatic frequency control circuit is applicable to the receiver for a satellite telecommunications apparatus.

29 Claims, 17 Drawing Sheets

AFC CIRCUIT HAVING LOCAL OSCILLATOR PHASE LOCKED LOOP

BACKGROUND OF THE INVENTION

1) Field of the Invention

The present invention relates to an automatic frequency control circuit (AFC) suitable for receivers within satellite telecommunication equipment.

2) Description of the Related Art

In recent years, with the development of information-oriented society, the satellite links via a communications satellite have been used as a means of setting telecommunications lines between plural stations.

In Japan, two telecommunications satellites, JC-SAT and Super-Bird, owned by private enterprises, (actually, plus two backup satellites) are now in service.

As well-known, the satellite telecommunications is carried out via a transponder in a satellite (stationary satellite) rotating on a stationary orbit over the equator about 36,000 kilometers. The stationary satellite actually drifts in an eight-figured locus (the locus of the projection point on the earth) at an angle viewed from the earth. Since this locus causes variations in frequency due to the Doppler effect, a certain countermeasure is needed to absorb the frequency variations.

At present, frequency bands each with 500 MHz are allocated for the satellite telecommunications. The frequency bands are split to be supplied respectively to transponders arranged in parallel. Hence, in the satellite telecommunications apparatus, it is required that each transponder can deal with any channels (CH) within a frequency band.

Usually, AFC circuits are used to absorb the frequency variations. In addition, to perform the channel switching operation, a synthesizer-type local oscillator for a frequency conversion is used.

FIG. 15(a) is a block diagram showing frequency bands to which transponders in a satellite link are allocated, respectively. FIG. 15(b) is a block diagram showing the frequency spectrum of channels (CH) arranged for each transponder.

FIG. 15(a) shows frequency bands each with an allocated band (500 MHz) to which transponders are arranged, respectively. As shown in FIG. 15(a), a plural of (about 30 or 32) transponders are respectively used within an allocated band. In order to use the radio waves effectively, the transponders are interleaved or alternately arranged for the vertical polarized wave (V-polarization) and the horizontal polarized wave (H-polarization).

The transponders are generally numbered (as Nos. 1 to 32 in FIG. 15). Usually, the telecommunications service supplier allocates transponders to users, respectively. A specific transponder is allocated when the link is used for a long period of time. In the case of a spot use of the telecommunications link, a transponder in vacant state is used according to the operation environment.

FIG. 15(b) shows the frequency spectrum of channels (CH) arranged for each transponder. The channel arrangement has its different form according to a kind of a transmitted signal or of the use aspect. In this case, small capacity, multichannels for telephones or facsimiles are shown. FIG. 15(b) shows a pilot signal or a carrier arranged at the center frequency and a guard band being a space arranged on both sides of the pilot signal. The guard band is arranged to process easily the AFC (to be described later).

In FIG. 15, signals on the telecommunications link are arranged outside of the guard band. The signals are allocated so as to have a constant channel spacing. Each channel is used, if necessary, temporarily. Hence, vacant channels have no signals. For convenience, the pilot signal is arranged at the center frequency of the transponder, but may be arranged at a different frequency.

FIG. 16 is a block diagram showing the theory of the AFC circuit. Referring to FIG. 16, the frequency converter 1 converts an input signal into a signal of a desired frequency. The local oscillator 2 supplies a local signal for frequency conversion to the frequency converter 1. The bandpass filter BPF 4 passes selectively a signal of a desired frequency among signals converted by the frequency converter 1. The reference oscillator (REF) 5 produces a reference signal to synchronize an input signal to a fixed frequency. The phase comparator 6 compares the output from the reference oscillator 5 with the output from the bandpass filter 4. The loop filter 7 smooths the output from the phase comparator 6 to output the outcome to the local oscillator.

In the AFC circuit configuration, an input signal is subjected to a frequency conversion by the frequency converter 1. In this case, a desired transponder is selected among the transponders within an allocated band of 500 MHz by suitably varying the frequency of the local oscillator 2. Then the bandpass filter 4 can take only the pilot signal out of the selected signal.

The phase comparator 6 compares the pilot signal with the reference signal from the reference oscillator 5 and outputs an error signal $\Delta\delta$, or a difference between the pilot signal and the reference signal. The error signal $\Delta\delta$ is outputted to the local oscillator 2 via the loop filter 7. The local oscillator 2 varies its output frequency according to the error signal $\Delta\delta$.

The configuration described above forms a phase synchronization loop to the pilot signal. If the frequency of the reference oscillator 5 is set to a desired pilot frequency fPL, the local oscillator 2 is controlled so as to set the frequency at a fixed value after the frequency converting operation, or the oscillation frequency of the reference oscillator 5, without depending on the variations in frequency of the input signal.

FIG. 17 is a block diagram showing a configuration of a conventional automatic frequency control circuit. In FIG. 17, like numerals are attached to elements similar to those shown in FIG. 16.

The automatic frequency control circuit shown in FIG. 17 is fundamentally identical to that shown in FIG. 16. As shown in FIG. 17, both the voltage controlled oscillator 3 and the frequency divider 10 are added to the automatic frequency control circuit.

The voltage controlled oscillator (VCO) 3 receives an error signal $\Delta\delta$ from the phase comparator via the loop filter 7 and then supplies a reference signal corresponding to the error signal $\Delta\delta$ to the local oscillator 2. The frequency divider 10 having a frequency division number M is arranged between the local oscillator 2 and the voltage controlled oscillator 3. The local oscillator 2 is constituted as a synthesizer (to be described later).

For the brief explanation, specific values are given in FIG. 17. In this case, the transponder No. 17 of the JC-SAT is used as an example. The transponder No. 17 has the center frequency of an allocated band of 500 KHz.

The center frequency of the transponder No. 17 is 12.50825 GHz. However, since the local oscillation is usually at 11.3 GHz for a video reception, the center frequency is block-converted to 950 to 1450 MHz in the L-band. In accordance with such a situation, the center frequency fRF of the input signal in FIG. 17 is 1208.25 MHz. When the frequency converter I converts the center frequency fIF of the intermediate frequency (IF) band to 140 MHz, the oscillation frequency fLO of the local oscillator 2 is 1068.25 MHz, according to the following formula:

$$fLO = fRF - fIF \qquad (1)$$

Since the channel arrangement in the transponder is set as shown in FIG. 15(b), the frequency fPL of the pilot signal is the same as the center frequency of the transponder, thus expressed as the following formula:

$$fPL = fIF \qquad (2)$$

Therefore, fPL is 140 MHz.

In this case, since 10 or 5 MHz is widely used for a higher stable reference oscillator, the output frequency fREF of the voltage controlled oscillator 3 is selected to 10 MHz.

In order to obtain a frequency fLO of 1068.25 MHz from a frequency fREF of 10 MHz, the local oscillator 2 is formed as a synthesizer type (phase locked loop (PLL)) oscillator including the voltage controlled oscillator 21, the loop filter 22, the phase comparator (PD: phase detector) 23, and the frequency divider 24. The frequency divider 24 divides a signal of an oscillation frequency fLO from the voltage controlled oscillator 21 to 1/N. The phase comparator 23 compares the outcome from the frequency divider 24 with the signal from the frequency divider 10 to produce an error signal. The error signal is inputted to the voltage controlled oscillator 21 via the loop filter 22 to adjust the output frequency fLO of the voltage controlled oscillator 21 in accordance with the error signal.

As shown in FIG. 16, the voltage controlled oscillator 2 may be directly controlled with the output from the loop filter 7. However, the voltage controlled oscillator 21 has a low frequency stability because of its high oscillation frequency and its wide band coverage of 500 MHz. This low stability does not cause any troubles at the AFC locking operation but may cause the operational failure due to a frequency shift at the rising or re-drawing time. This type of configuration is not used in most commercially-used apparatuses. Hence, the synthesizer-type local oscillator 2, as shown in FIG. 17, is widely used.

As described above, if fLO= 1068.25 MHz and fREF= 10 MHz, the relation is expressed as follows:

$$fLO = N \cdot fR \qquad (3)$$

where fR is an output frequency of the frequency divider 10, or a comparison frequency of the phase comparator 23, and N is a positive integer division number of the frequency divider 24. In this case, since fR is 250 KHz, N=4273 and M=40.

In the AFC configuration shown in FIG. 17, the phase noise of the local oscillator 2 that affects seriously the quality of the telecommunications line will be studied below.

If the PLL oscillator shown in FIG. 17 is used as the local oscillator 2, the output phase noise depends on the noise floor, VCO noise, or the like. Particularly, the noise floor is dominant within the loop band. The noise level is as follows:

$$PNout = PNPD + 20 \cdot \log N \text{ (dBc/Hz)} \qquad (4)$$

where PNout is a phase noise of the local oscillator 22, PNPD is a noise floor of the phase comparator 23, and N is a frequency division number of the frequency divider 24. There are variations in the noise level of the phase comparator 23 published in many papers. Here, let us use an average PNPD= −140 dBc/Hz. Using the above condition, the noise level PNout, shown in FIG. 17, is calculated as follows:

$$\begin{aligned} PNout &= [-140 + 20 \times \log(4273)] \text{ (dBc/Hz)} \\ &= -67.4 \text{ dBc/Hz} \end{aligned}$$

The final noise level at the frequency fIF in the output signal is an addition of the noise level at the center frequency fRF in the input signal and the noise level at the frequency fLO in the signal from the local oscillator (voltage controlled oscillator 21) 2. Hence, in order to improve the noise level, it is efficient to reduce the frequency division number N of the frequency divider 24.

Now, let us study the concrete measure that reduces the frequency division number N of the frequency divider 24. It is required that the local oscillator 2 can be varied to a suitable frequency over the 500 MHz band to select a specific transponder. In the case of the JC-SAT, the transponders are arranged at 30 MHz intervals or 15 MHz intervals, in consideration of the vertically polarized wave in an interleaved arrangement.

Hence, the output frequency step of the local oscillator 2 is preferably 15 MHz. Based on the theory of the PLL oscillation, the phase comparator 23 has a comparison frequency fR of 15 MHz. Increasing the frequency fR can decrease the frequency division number N of the frequency divider 24.

The frequency division number N can be decreased according to the mutual frequency intervals. However, since the requirement to the absolute frequency of 1068.25 MHz fixes the comparison frequency fR to 250 KHz, the frequency division number N cannot be reduced. Hence, there is a disadvantage in that the frequency division number N larger than the functionally required value leads to degradation due to noises.

SUMMARY OF THE INVENTION

The present invention is made to overcome the above mentioned problems. An object of the present invention is to provide an automatic frequency control circuit that can set the frequency division number of the local oscillator to a small value without requiring an absolute frequency, thus obtaining a signal with low noise and an improved telecommunications line quality.

In order to achieve the above objects, according to the present invention, the automatic frequency control circuit is charactrized by a frequency converter for converting an input signal into a signal with a desired frequency; a local oscillator having a synthesizer configuration for supplying a local signal for a frequency conversion to the frequency converter; a voltage controlled oscillator for supplying a first reference signal to the local oscillator; a bandpass filter for passing a signal with a desired frequency among signals converted by the frequency converter; a reference oscillator for supplying a second reference signal being a reference signal to synchronize the input signal to a fixed frequency; a phase comparator for comparing the output from the reference oscillator with the output from the bandpass filter; a loop filter for smoothing the output from the phase comparator to output the smoothed voltage as a control voltage to the voltage controlled oscillator; and a voltage source for producing a desired voltage and an adder for adding the output from the voltage source to a signal from a circuit portion ranging from the phase comparator to the voltage controlled oscillator, to offset an oscillation frequency of the first reference signal from the voltage controlled oscillator.

According to the automatic frequency control circuit, the adder adds the output from the voltage source to the signal from a circuit portion ranging from phase comparator to the voltage controlled oscillator to vary the oscillation frequency of the voltage controlled oscillator. Since the frequency of a local signal from the local oscillator, or the frequency converted by the frequency converter, can be shifted to a desired value, the step of the local oscillator can be determined only by a necessary condition for a transponder selection, without requiring an absolute frequency. Hence, since the frequency division number of the local oscillator can be reduced by increasing the comparison frequency, the noise level that affects largely the quality in the communications line can be suppressed to a small value. This feature contributes to an improved performance of the automatic frequency control circuit and an improved quality in the communications line.

Like the above configuration, the automatic frequency control circuit is characterized by a frequency converter; a local oscillator; a voltage controlled oscillator; a bandpass filter; a reference oscillator; a phase comparator; a loop filter; a voltage source for producing a desired voltage to offset an oscillation frequency of the first reference signal from the voltage controlled oscillator; and an adder for adding the output from the voltage source to an oscillation frequency control signal from the local signal oscillator.

According to the automatic frequency control circuit, the adder adds the output from the voltage source to the oscillaltion frequency control signal of the local oscillator to vary the oscillation frequency of the voltage controlled oscillator. Hence, the frequency of a signal from the local oscillator, or the frequency converted by the frequency converter, can be shifted to a desired value and the noise level that affects the quality of the telecommunications line can be suppressed to a small value. This feature can realize an improved performance of the automatic frequency control circuit and an improved quality in the telecommunications line.

The automatic frequency control circuit is characterized by a frequency converter; a local oscillator; a voltage controlled oscillator; a bandpass filter; a reference oscillator; a phase comparator; a loop filter; a first voltage source for producing a desired voltage to offset the oscillation frequency of the voltage controlled oscillator; an adder for adding the output from the first voltage source to a signal of a circuit portion ranging the phase comparator to the voltage controlled oscillator; a second voltage source for providing a desired voltage to offset the oscillation frequency of the local oscillator; and a second adder for adding the output from the second voltage source to an oscillation control signal of the local oscillator.

According to the automatic frequency control circuit, the first adder adds the output from the first voltage source to the signal from a circuit portion ranging from the phase comparator to the voltage controlled oscillator while the second adder adds the output from the second voltage source to the oscillation frequency control signal from the local oscillator. Thus, the oscillation frequency of the voltage controlled oscillator is varied to shift the frequency of a local signal from the local oscillator, or the frequency converted by the frequency converter, to a desired value. Hence, since the noise level that affects the quality of the telecommunications line can be suppressed to a small value, the performance of the automatic frequency control circuit as well as the quality of the telecommunications line can be improved. By adjusting coarsely both the second voltage source and the second adder and adjusting finely both the first voltage source and the first adder, the shift of the oscillation frequency of the local oscillator, or the frequency converted by the frequency converter, can be adjusted with high accuracy.

Furthermore, the automatic frequency control circuit is characterized by a frequency converter; a local oscillator; a voltage controlled oscillator; a bandpass filter; a reference oscillator; a phase comparator; a loop filter; and a frequency offset control unit for controlling an offset of the center frequency of the bandpass filter to offset the center frequency of the bandpass filter.

The automatic frequency control circuit can offset the center frequency of the bandpass filter. Since the frequency offset controller controls the offset of the center frequency of the bandpass filter, the frequency converter can shift the converted frequency to a desired value only by controlling the offset of the center frequency of the bandpass filter, without controlling the oscillation frequency of the reference oscillator. As mentioned above, this feature can suppress the noise level affecting largely the quality in the telecommunications line, thus improving the performance of the automatic frequency control circuit and quality in the telecommunications line.

The automatic frequency control circuit is characterized by a frequency converter; a local oscillator; a voltage controlled oscillator; a bandpass filter; a reference oscillator; a phase comparator; a loop filter; and a frequency offset control unit for controlling both an offset of the center frequency of the bandpass filter and an offset of the frequency of the reference oscillator, to offset the center frequency of the bandpass filter.

According to the automatic frequency control circuit, the bandpass filter can control the offset of its center frequency and the frequency offset control unit can control the offset of the center frequency of the bandpass filter as well as the offset of the oscillation frequency of the reference oscillator to vary the oscillation frequency of the voltage controlled oscillator. Hence, by varying the oscillation frequency of the voltage controlled oscillator, without using the phase comparator with less frequency dependency, the frequency of a local signal from the local oscillator, or the frequency converted by the frequency converter, can be shifted. Hence, the noise affecting the quality of the telecommunications line can be suppressed so that it is possible to improve the performance of the automatic frequency control circuit and the quality of the telecommunications line.

DESCRIPTION OF THE PREFERRED EMBODIMENTS

Referring to the attached drawings, explanation will be made in detail as for preferred embodiments according to the present invention.

Figure 1:
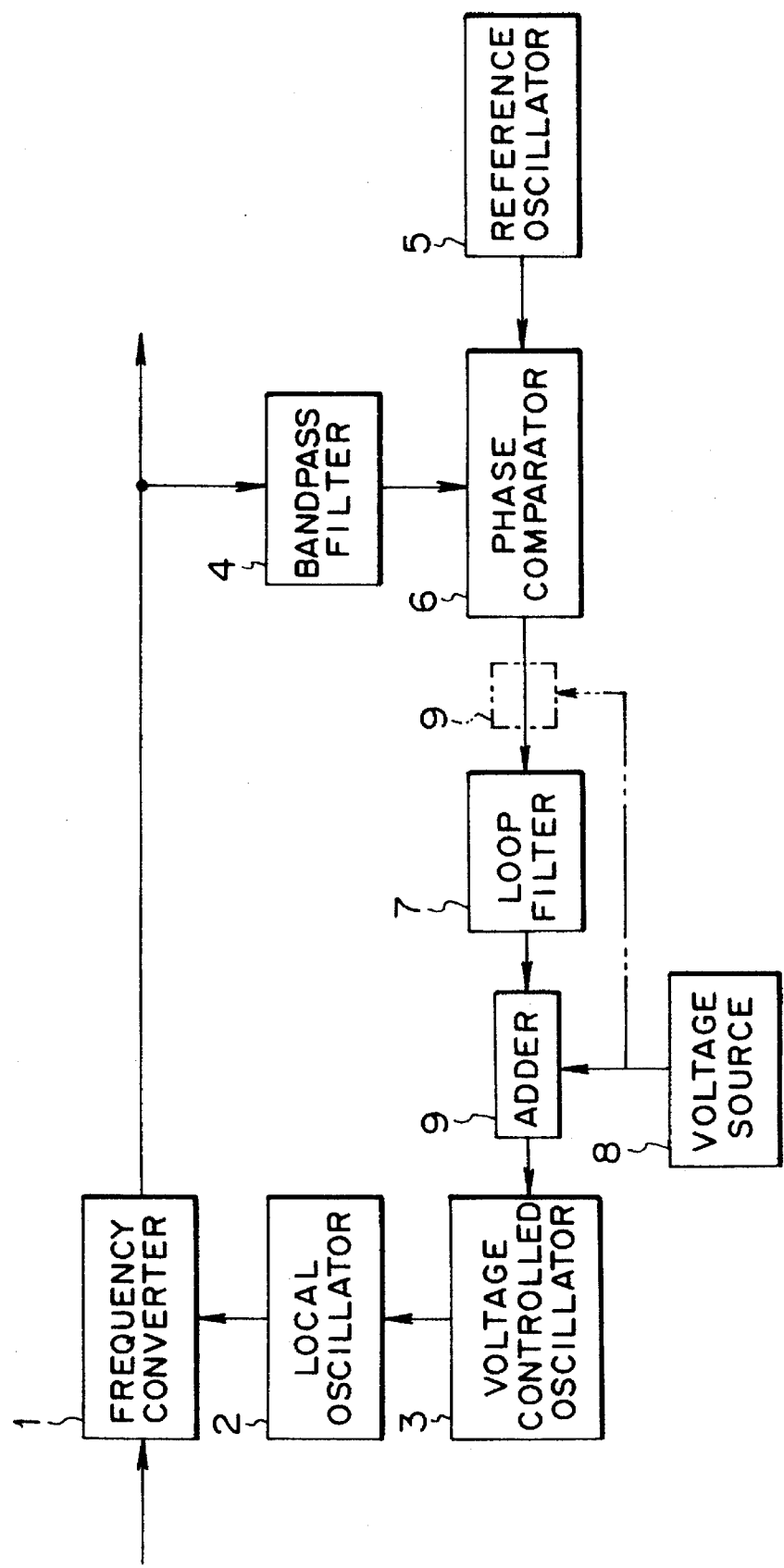
FIG. 1 is a block diagram showing an aspect of the present invention.

(a) The aspect of the invention:

FIG. 1 is a block diagram used for explaining an aspect of the present invention. Referring to FIG. 1, numeral 1 represents a frequency converter for converting an input signal into a signal with a desired frequency, 2 represents a local oscillator in a synthesizer configuration for producing a local signal for a frequency conversion to the frequency converter 1, 3 represents a voltage controlled oscillator for producing a first reference signal to the local oscillator 3, 4 represents a bandpass filter for passing a signal with a desired frequency among signals converted by the frequency converter 1, 5 represents a reference oscillator for producing a second reference signal acting as a reference signal to synchronize the input signal to a fixed frequency, 6 represents a phase comparator for comparing the output from the reference oscillator 5 with the output from the bandpass filter 4, and 7 represents a loop filer for smoothing the output from the phase comparator 6 to produce the outcome as a control voltage to a voltage controlled oscillator 3.

In order to offset the oscillation frequency of the voltage controlled oscillator 3, the frequency control circuit also includes a voltage source 8 for producing a desired voltage and an adder 9 for adding the output from the voltage source 8 to a signal of a circuit portion ranging from the phase comparator 6 to the voltage controlled oscillator 3.

The adder 9, as shown with the solid line in FIG. 1, may be arranged between the voltage controlled oscillator 3 and the loop filter 7, or between the phase comparator 6 and the loop filter 7, as shown with the chain double-dashed line in FIG. 1.

The voltage from the voltage source 8 is set based on a value of:

$$\Delta fLO/KRF.N$$

where $\Delta fLO$ is a difference between the frequency of a local signal from the local oscillator 2, the local signal being needed originally as a local signal for a frequency conversion to the frequency converter 1, and the frequency of a local signal outputted from the local oscillator 2 in response to the oscillation frequency of the first reference signal from the voltage controlled oscillator 3, KRF is a control voltage sensitivity of the voltage controlled oscillator 3, and N is a frequency division number in the local oscillator 2.

Moreover, a frequency divider may be arranged between the local oscillator 2 and the voltage controlled oscillator 3. In this case, the voltage from the voltage source 8 is set based on a value of:

$$(\Delta fLO.M)/(KRF.N)$$

where $\Delta fLO$ is a difference between the frequency of a local signal from said local oscillator 2, the local signal being needed originally as a local signal for a frequency conversion to the frequency converter 1, and the frequency of a local signal outputted from the local oscillator in response to the oscillation frequency of the first reference signal from the voltage controlled oscillator 3 via the frequency divider, M is a frequency division number of the local oscillator, KRF is a control voltage sensitivity of the voltage controlled oscillator 3, and N is a frequency division number of the local oscillator 2.

In the automatic frequency control circuit shown in FIG. 1, the adder 9 adds the output from the voltage source 8 to the signal from a circuit portion ranging from the phase comparator 6 to the voltage controlled oscillator 3 to vary the oscillation frequency from the voltage controlled oscillator 3. As a result, the frequency of a local signal from the local oscillator 2, or the frequency of a signal converted by the frequency converter I can be shifted to a desired value.

The adder 9 arranged between the voltage controlled oscillator 3 and the loop filter 7 adds the output from the voltage source 8 to the output from the loop filter 7, thus providing the added output as a control voltage from the voltage controlled oscillator 3. When the adder 9 is arranged between the phase comparator 6 and the loop filter 7, it adds the output from the voltage source 8 to the output from the phase comparator 6, thus providing the added output as a control voltage from the voltage controlled oscillator 3 via the loop filter 7.

In this case, the frequency of a local signal from the local oscillator 2, or the frequency of a signal converted by the frequency converter 1, can be shifted to a suitable value by setting the voltage from the voltage source 8, based on a value of:

$$\Delta fLO/(KRF.N)$$

where $\Delta fLO$ is a difference between the frequency of a local signal needed originally as a local signal for a frequency conversion to the frequency converter, and the frequency of a local signal outputted actually from said local oscillator 2, KRF is a control voltage sensitivity of the voltage controlled oscillator 3, and N is a frequency division number in the local oscillator 2.

With the frequency converter arranged between the local oscillator 2 and the voltage controlled oscillator 3, the frequency of a local signal from the local oscillator 2, or the frequency of a signal converted by the frequency converter 1, can be shifted to a suitable value by setting the voltage from the voltage source 8 based on a value of:

$(\Delta fLO \cdot M)/(KRF \cdot N)$ where ΔfLO is a difference between the frequency of a local signal needed originally as a local signal for a frequency conversion to the frequency converter, and the frequency of a local signal outputted actually from the local oscillator 2, M is a frequency division number in the local oscillator, KRF is a control voltage sensitivity of the voltage controlled oscillator 3, and N is a frequency division number in the local oscillator 2.

According to the automatic frequency control circuit, the adder 9 adds the output from the voltage source 8 to the signal from a circuit portion ranging from the phase comparator 6 to the voltage controlled oscillator 3 to vary the oscillation frequency from the voltage controlled oscillator 3, whereby the frequency of a local signal from the local oscillator 2, or the frequency of a signal converted by the frequency converter 1, can be shifted to a desired value. Hence, the frequency step of the local oscillator 2 can be determined only under the condition necessary for a transponder selection, without a request for the absolute frequency, and the frequency division number of the local oscillator 2 can be reduced by increasing the comparison frequency. These features can contribute to the suppression of the noise levels affecting largely the telecommunications line, an improved performance of the automatic frequency control circuit, and an improved quality of the telecommunication line.

Figure 2:
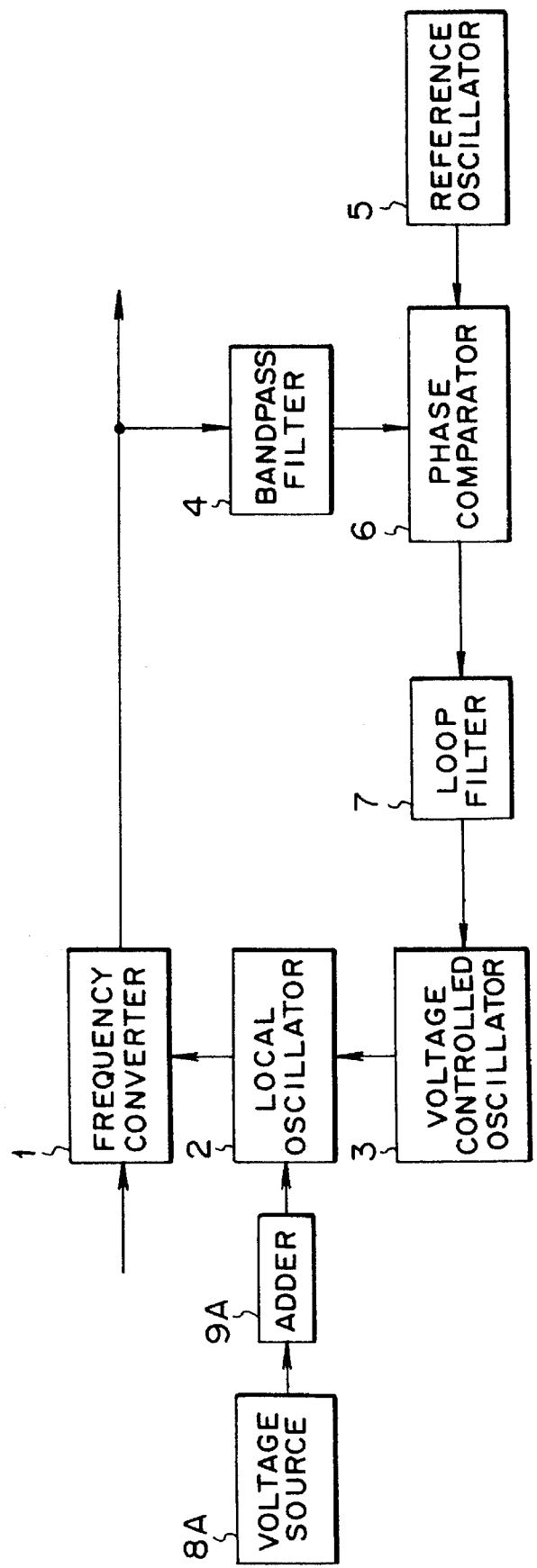
FIG. 2 is a block diagram showing an aspect of the present invention.

FIG. 2 is a block diagram showing an aspect of the present invention. Like numerals are attached to elements similar to those shown in FIG. 1. Hence, the detail explanation will be omitted here. As shown in FIG. 2, according to the second aspect of the present invention, the automatic frequency control circuit includes the voltage source 8A for producing a desired voltage to offset the oscillation frequency of the local oscillator 2, and the adder 9A for adding the output from the voltage source 8A to the oscillation frequency control signal from the local oscillator 2.

In this case, the voltage of the voltage source 8A is set based on the value of (ΔfLO/KVCO), where ΔfLO is a difference between the frequency of a local signal from the local oscillator 2, the local signal originally needed as a local signal for frequency conversion to the frequency converter 1, and KVCO is the frequency sensitivity of the local oscillator 2.

In the automatic frequency control circuit shown in FIG. 2, since the adder 9A adds the output from the voltage source 8A to the frequency control signal of the local oscillator 2, the oscillation frequency from the local oscillator 2 can be varied, thus shifting the local signal frequency of the local oscillator 2, or the frequency converted by the frequency converter 1 to a desired value.

By setting the voltage from the voltage source 8A based on a value of (ΔfLO/KVCO), where ΔfLO is a difference between the frequency of a local signal originally needed and the frequency of a local signal outputted actually from the local oscillator 2 and the KVCO is the sensitivity of the local oscillator 2, the frequency of a local signal from the local oscillator 2, or the frequency of a signal converted by the frequency converter 1, can be shifted to a suitable value.

According to the automatic frequency control circuit, since the adder 9A adds the output from the voltage source 8A to the oscillation frequency control signal of the local oscillator 2, it can vary the oscillation frequency of the local oscillator 2, thus shifting the frequency of a local signal from the local oscillator 2, or the frequency converted by the frequency converter 1, to a desired value. Thus, the noise level affecting the quality of the communications line can be suppressed. This feature can effectively improve the performance of the automatic frequency control circuit and the quality of the telecommunications line.

Figure 3:
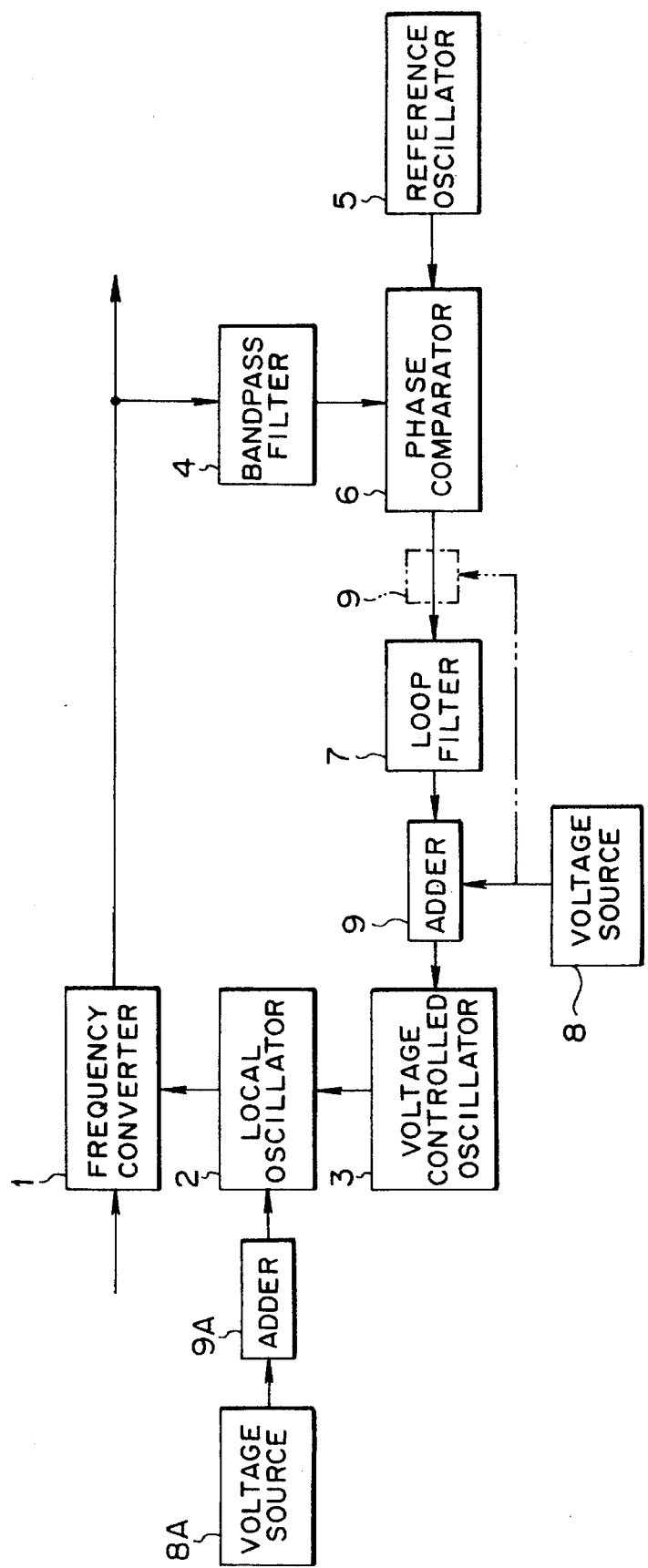
FIG. 3 is a block diagram showing an aspect of the present invention.

FIG. 3 is a block diagram showing an aspect of the present invention. Like numerals are attached to elements similar to those shown in FIG. 1. Hence the detail explanation will be omitted below. Referring to FIG. 3, the automatic frequency control circuit includes a first voltage source 8 for producing a desired voltage to offset the oscillation frequency of the voltage controlled oscillator 3, an adder 9 for adding the output from the first voltage source 8 to the signal from a circuit portion ranging from the phase comparator 6 to the voltage controlled oscillator 3, a second voltage source 8A for producing a desired voltage to offset the oscillation frequency of the local oscillator 2, and a second adder 9A for adding the output from the second voltage source 8A to an oscillation frequency control signal of the local oscillator 2.

Referring to FIG. 3, the first adder 9 may be arranged between the voltage controlled oscillator 3 and the loop filter 7, as shown with the solid line, or between the phase comparator 6 and the loop filter 7, as shown with the chain double-dashed line.

The voltage of the first voltage source 8 is set based on a value of:

$\Delta fLO/(KRF \cdot N)$ where ΔfLO is a difference between the frequency of a local signal from the local oscillator 2, the local signal being originally needed as a local signal for frequency conversion to the frequency converter 1, and the oscillation frequency of a first reference signal from the voltage controlled oscillator 3, KRF is the voltage sensitivity of the voltage controlled oscillator 3, and N is the frequency division number of the local oscillator 2, while the voltage from the second voltage source 8A is set based on a value of:

$\Delta fLO/KVCO$ where ΔfLO is the difference frequency, and KVCO is the control sensitivity of the local oscillator 2.

A frequency divider can be arranged between the local oscillator 2 and the voltage controlled oscillator 3. In this case, the voltage from the first voltage source 8 is set to a value of:

$(\Delta fLO \cdot M)/(KRF \cdot N)$ where ΔfLO is a difference between the frequency of a local signal from the local oscillator 2, the local signal being originally needed as a local signal for frequency conversion to the frequency converter 1, and the oscillation frequency of a first reference signal from the voltage controlled oscillator 3 via the frequency divider, M is a frequency division number of the frequency divider, KRF is the voltage sensitivity of the voltage controlled oscillator 3, and N is the frequency division number of the local oscillator 2, while the voltage from the second voltage source 2 is set based on a value of:

$\Delta fLO/KVCO$ where ΔfLO is the difference frequency, and KVCO is the control sensitivity of the local oscillator 2.

In the automatic frequency control circuit shown in FIG. 3, since the first adder 9 adds the output from the first voltage source 8 to the signal from a circuit portion ranging from the phase comparator 6 to the voltage controlled oscillator 3 and the second adder 9A adds the output from the second voltage source 8A to the oscillation frequency control signal of the local oscillator 2, the oscillation frequency of the voltage controlled oscillator 3 is varied, whereby the local signal frequency of the local oscillator 2, or the frequency converted by the frequency converter 1 can be shifted to a desired value. In this case, both the second voltage source 8A and the second adder 9A perform a coarse frequency adjustment while both the first voltage source 8 and the first adder 9 perform a fine frequency adjustment.

With the first adder 9 arranged between the voltage controlled oscillator 3 and the loop filter 7, the output from the first voltage source 8 is added to the output from the loop filter 7 and then the added outcome is outputted as a control signal for the voltage controlled oscillator 3. With the first adder 9 arranged between the phase comparator 6 and the loop filter 7, the output from the first voltage source 8 is added to the output from the phase comparator 6 and then the added outcome is outputted as a control signal for the voltage controlled oscillator via the loop filter 7.

In this case, the voltage from the first voltage source 8 is set based on a value of $\Delta fLO/(KRF.N)$, where $\Delta fLO$ is a difference between the frequency of a local signal originally needed and the frequency of a local signal outputted actually from the local oscillator 2, KRF is the control voltage sensitivity of the voltage controlled oscillator, and N is the frequency division number for the local oscillator 2, and the voltage from the second voltage source 8A is set based on a value of $\Delta fLO/KVCO$, where $\Delta fLO$ is the difference frequency and KVCO is the control sensitivity of the local oscillator 2. As a result, the frequency of a local signal from the local oscillator 2, or the frequency converted by the frequency converter 1 can be shifted to a suitable value.

With a frequency divider arranged between the local oscillator 2 and the voltage controlled oscillator 3, the voltage from the first voltage source 8 is set based on a value of $(\Delta fLO.M/(KRF.N)$, where $\Delta fLO$ is a frequency difference between the frequency of a local signal from the local oscillator 2 originally needed and the frequency of a local signal outputted actually from the local oscillator 2, M is the frequency division number of the frequency divider, KRF is the control voltage sensitivity of the voltage controlled oscillator 3, and N is the frequency division number of the frequency divider, while the voltage from the second voltage source 8A is set based on a value of $(\Delta fLO/KVCO)$, where fLO is the frequency difference and KVCO is the control sensitivity of the local oscillator 2. As a result, the frequency of a local signal from the local oscillator 2, or the frequency of a signal converted by the frequency converter 1, can be shifted to a suitable value.

As described above, according to the automatic frequency control circuit, the first adder 9 adds the output from the first voltage source 8 to the signal from a circuit portion ranging from the phase comparator 6 to the voltage controlled oscillator 3 while the second adder 9A adds the output from the second voltage source 8A to the oscillation frequency control signal of the local oscillator 2. The local signal frequency of the local oscillator 2, or the frequency converted by the frequency converter 1, can be shifted to a desired value by varying the oscillation frequency of the voltage controlled oscillator 3. As a result, the noise level affecting largely the quality of the telecommunications line can be suppressed. This feature realizes an improved performance of the automatic frequency control circuit and an improved quality in the telecommunications line. Since the second voltage source 8A and the second adder 9A can perform a coarse frequency adjustment and the first voltage source 8 and the first adder 9 can perform a fine frequency adjustment, there is an advantage in that the oscillation frequency of the local oscillator 2, or the shift in the frequency converted by the frequency converter, can be adjusted with high accuracy.

Figure 4:
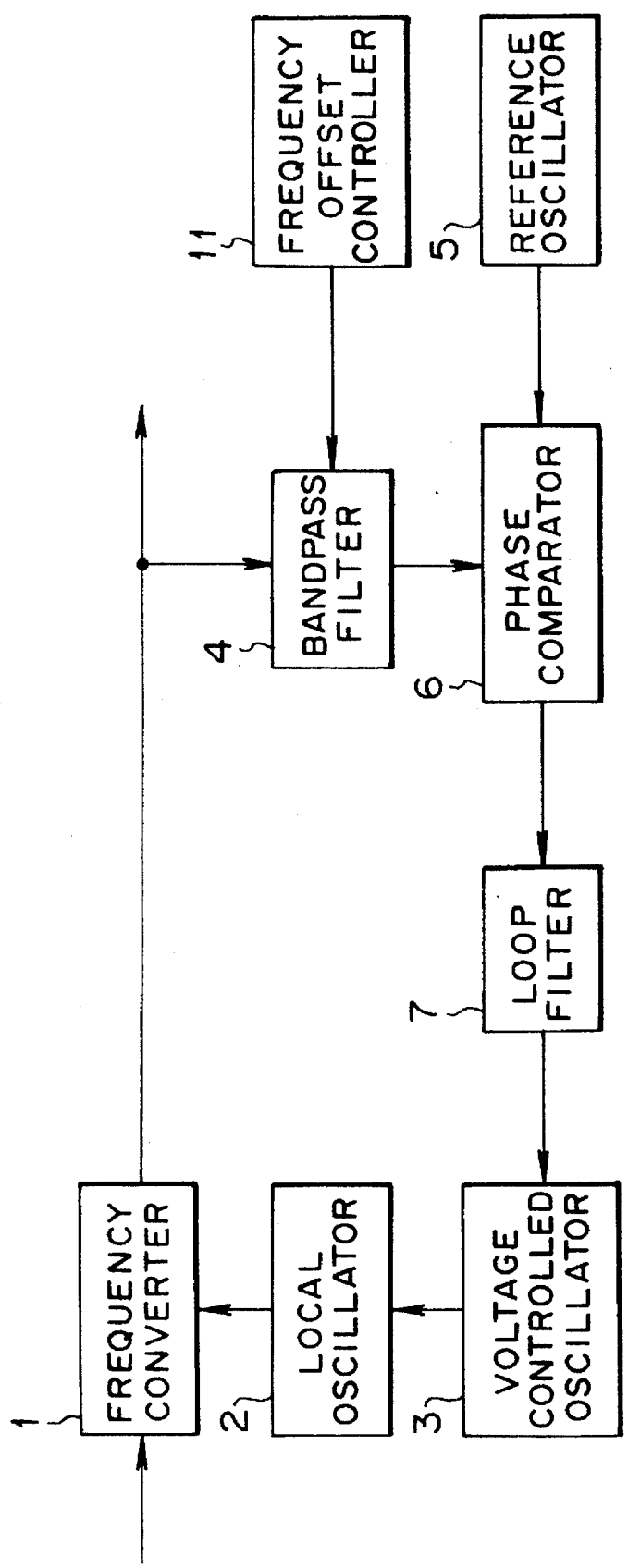
FIG. 4 is a block diagram showing an aspect of the present invention.

FIG. 4 is a block diagram showing an aspect of the present invention. Like numerals are attached to elements similar to those shown in FIG. 1. Hence the duplicate explanation will be omitted here. As shown in FIG. 4, according to the fourth embodiment, the bandpass filter 4 can offset its center frequency. The frequency offset controller 11 is arranged to control the offset of the bandpass filter 4. For this embodiment, the phase comparator 6 is chosen which has less frequency dependency.

The automatic frequency control circuit, shown in FIG. 4, can offset the center frequency of the bandpass filter. The frequency offset controller 11 controls the offset of the center frequency of the voltage controlled oscillator 3 to vary the oscillation frequency of the voltage controlled oscillator 3. As a result, the local signal frequency of the local oscillator 2, or frequency converted by the frequency converter 1, can be shifted to a desired value.

The phase comparator 6 with less frequency dependency can shift the frequency converted by the frequency converter 1 to a desired value only by controlling the offset of the center frequency of the bandpass filter 4, without controlling the oscillation frequency of the reference oscillator 5.

According to the automatic frequency control circuit, controlling the offset of the center frequency of the bandpass filter 4, without controlling the oscillation frequency of the reference oscillator 5, allows shifting the frequency converted by the frequency converter 1 to a desired value. Thus, the noise level affecting largely the quality in the communications line can be suppressed, whereby the quality of the automatic frequency control circuit as well as the quality in the communications line can be improved.

Figure 5:
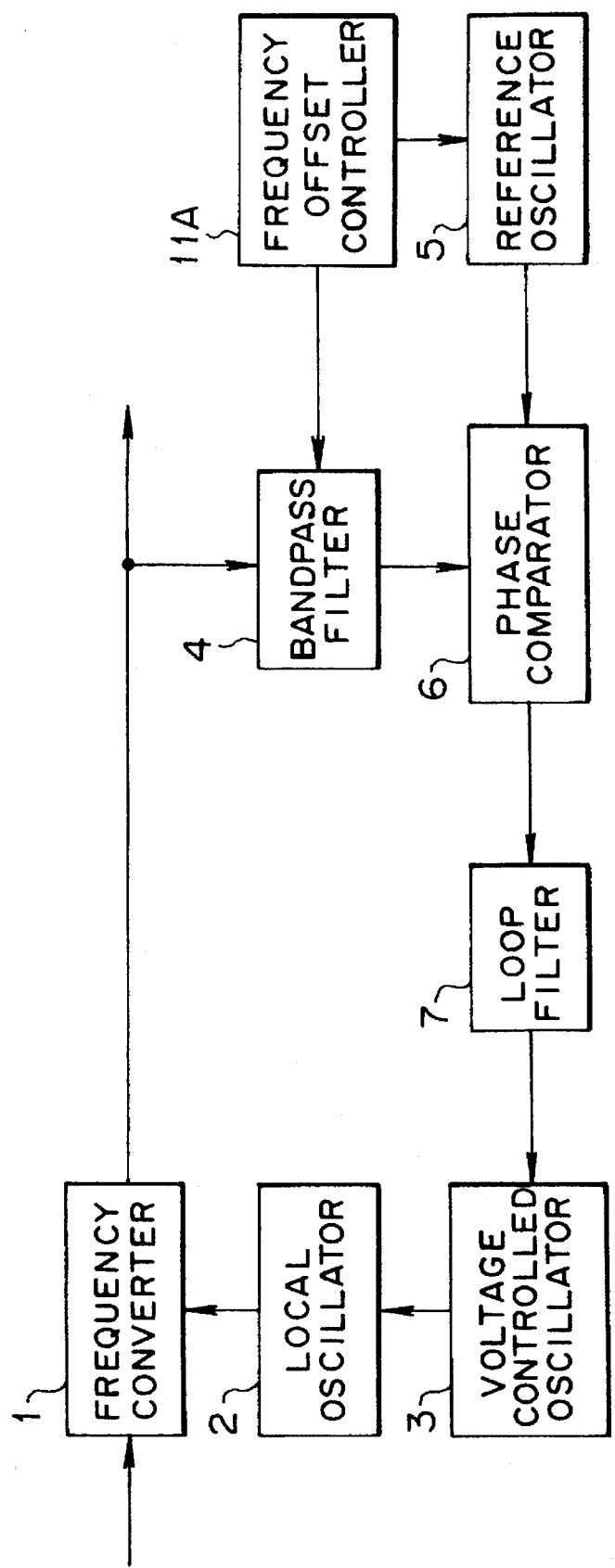
FIG. 5 is a block diagram showing an aspect of the present invention.

FIG. 5 is a block diagram showing an aspect of the present invention. Like numerals are attached to elements similar to those shown in FIG. 1. Hence the duplicate explanation will be omitted below. As shown in FIG. 5, according to the fifth embodiment, the bandpass filter 4 can offset the center frequency. The frequency offset controller 11A is arranged to control both the offset of the center frequency of the bandpass filter 4 and the offset of the oscillation frequency of the reference oscillator 5.

In the automatic frequency control circuit shown in FIG. 5, the bandpass filter 4 is formed so as to offset the center frequency. The frequency offset controller 11 controls the offset of the center frequency of the frequency offset controller 11 and the offset of the oscillation frequency of the reference oscillator 5 to vary the oscillation frequency of the voltage controlled oscillator 3. As a result, without using the phase comparator with less frequency dependency, the local signal frequency of the local oscillator 2, or the frequency converted by the frequency converter 1, can be shifted to a desired value. Similarly, the noise level that affects largely the quality of the telecommunications line can be suppressed to improve the performance of the automatic frequency control circuit and the quality of the telecommunications line.

Figure 6:
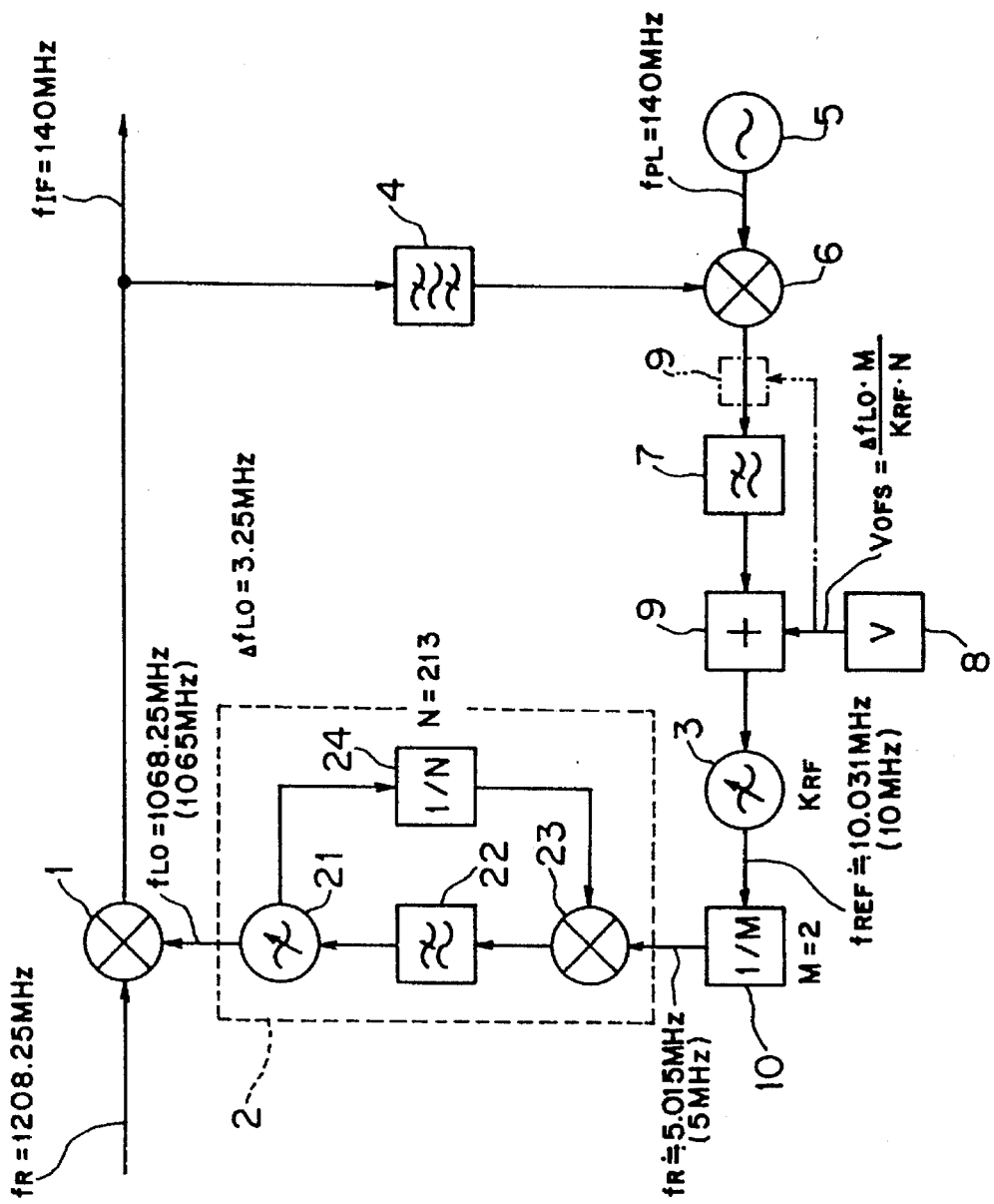
FIG. 6 is a block diagram showing the first embodiment according to the present invention.

(b) Explanation of First Embodiment:

FIG. 6 is a block diagram showing the first embodiment of the present invention. As shown in FIG. 6, the automatic frequency control circuit (hereinafter, referred to an AFC circuit) of the first embodiment is fundamentally similar to that shown in FIG. 17. The automatic frequency control circuit includes the frequency converter 1, the local oscillator 2, the voltage controlled oscillator (VCO) 3, the bandpass filter (BPS) 4, the reference oscillator 5, the phase comparator 6, the loop filter 7, and the frequency divider 10 with the frequency division number M. Like the configuration shown in FIG. 17, the local oscillator 2 is formed of a synthesizer (PLL circuit) including the voltage controlled oscillator 21, the loop filter 22, the phase comparator 23, and the frequency divider 24 with frequency division number N.

This embodiment, as shown in FIG. 6, includes the voltage source 8 and the adder 9 to offset the oscillation frequency of the voltage controlled oscillator 3. The voltage source 8 produces a desired voltage. The adder 9 is arranged between the voltage controlled oscillator 3 and the loop filter 7 to add the output from the loop filter 7 to the output from the voltage source 8. The adder 9, as shown in FIG. 6 with the chain double-dashed line, may be arranged between the phase comparator 6 and the loop filter 7 to add the output from the phase comparator to the output from the voltage source 8.

The comparison frequency fR of a signal to the local oscillator 2 (or the output frequency of the frequency divider 10) is set to a frequency corresponding to the space between the transponders. Hence, as is clear from the formula (3), the local oscillator 2 produces an output with a frequency integer times the comparison frequency fR. With no adjustment, the frequency fIF converted by the frequency converter 1 is not the center frequency originally needed. Hence, the pilot signal is cut by the bandpass filter 4, thus being not able to capture to the AFC loop.

In this embodiment, the adder 9 adds the offset voltage (VOFS) from the voltage source 8 to the control voltage to be inputted to the voltage controlled oscillator 3 (or the output from the loop filter 7 or the phase comparator 6). Thus, the output frequency of the voltage controlled oscillator 3, or the comparison frequency fR from the frequency divider 10, is varied so that the oscillation frequency fLO of the local oscillator 2, or the frequency fIF converted by the frequency converter 1, can be shifted to the center frequency (a desired value) in accordance with the formula (3).

Setting the output voltage (VOFS) from the voltage source 8 to a suitable value allows the frequency converter 1 to convert the conversion frequency fIF to a desired (center) frequency. The signal with the converted frequency passes the bandpass filter 4 to lock the AFC loop.

According to the present embodiment, the offset voltage VOFS outputted from the voltage source 8 is expressed by the following formula (5):

VOFS=(ΔfLO.M)/(KRF.N)    (5)

where ΔfLO is a difference between the frequency of a local signal from the local oscillator 2, the local signal being needed originally as a local signal for a frequency conversion to the frequency converter 1, and the frequency of a local signal actually outputted from the local oscillator 2 in response to a frequency integer times the oscillation frequency (comparison frequency) fR of the first reference signal from the voltage controlled oscillator 3 via the frequency divider 10, M is a frequency division number of the frequency divider 10, KRF is a control voltage sensitivity of the voltage controlled oscillator 3, and N is a frequency division number in the local oscillator 2.

It is not required necessarily that the voltage source 8 must output a voltage VOFS with high accuracy. If the conversion frequency fIF of the frequency converter I is polarized within the guard band or filtering band, the AFC loop drawing effect stabilizes the frequency to an originally desired value. Since the loop control is effected after the drawing effect, it is not needed to remove the offset voltage.

As described above, the frequency division number N of the local oscillator 2 can be decreased, without depending on the condition of the output frequency, whereby the noises can be suppressed largely.

The function and effect of the present embodiment will be explained below with reference to a concrete numerical example. For the simple comparison, various figures on the frequency conditions according to the present embodiment are shown in accordance with the example in FIG. 17. Like the example shown in FIG. 17, the concrete numerals are listed in FIG. 6.

Figure 17:
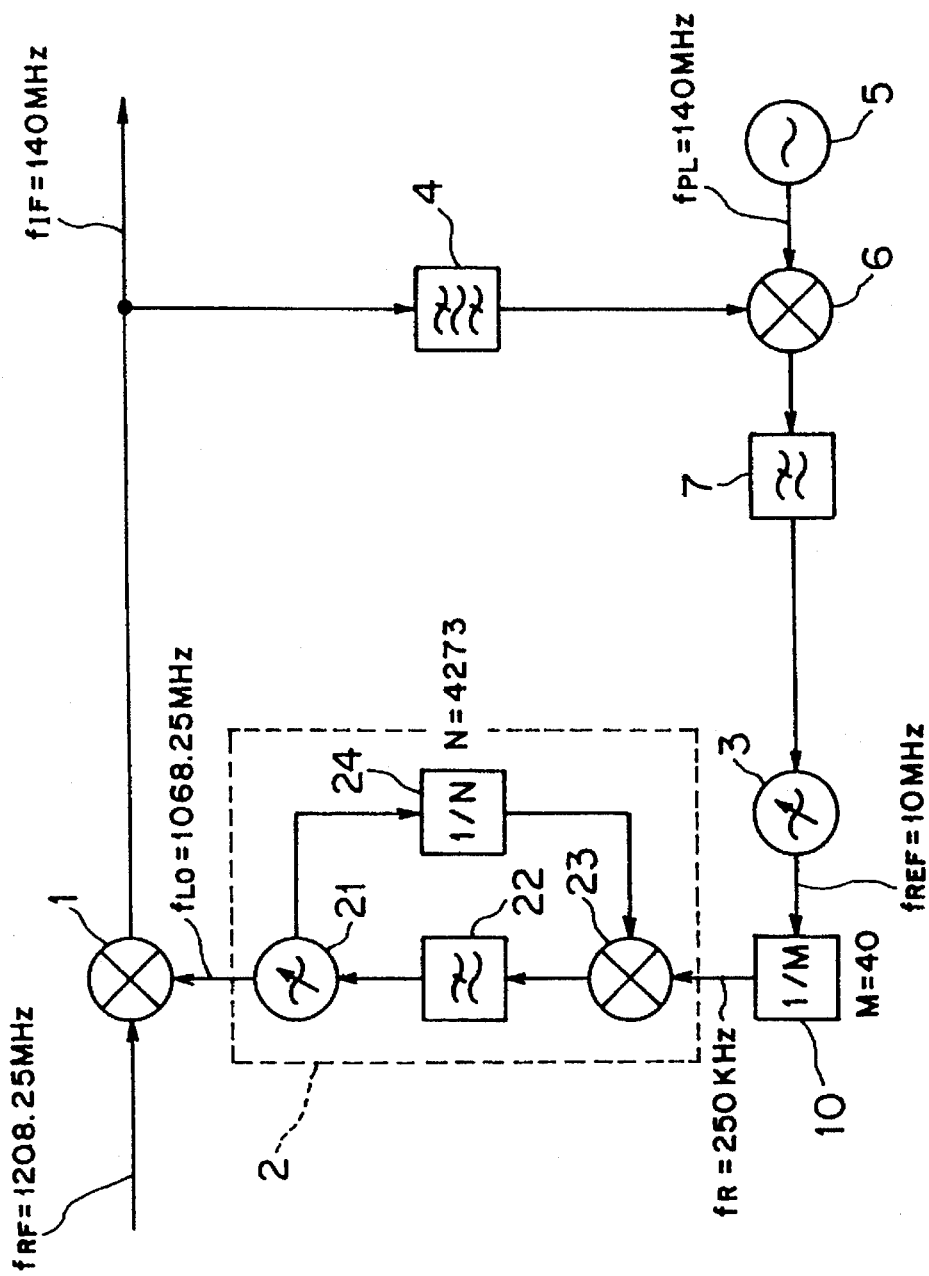
FIG. 17 is a block diagram showing the structural example of a conventional automatic frequency control circuit.

If the comparison frequency fR which corresponds to the space between the transponders is set to the local oscillator 2, fR= 15 MHz. In FIG. 17, since the oscillation frequency fREF of the voltage controlled oscillator 3 is 10 MHz and the frequency division number M of the frequency divider 10 is 2, fR= 5 MHz.

The local oscillator 2 produces a local signal with a frequency fLO of 1065 MHz, with respect to an originally-desired frequency or 1068.25 MHz, whereby the difference ΔfLO is 3.25 MHz. Hence, if the voltage source 8 and the adder 9 supplies an offset voltage VOFS in accordance with the formula (5) to adjust the oscillation frequency fREF of the control oscillator 3 to about 10.031 MHz, the comparison frequency fR of the frequency divider 10 becomes about 5.015 MHz while the oscillation frequency of the local oscillator 2 becomes about 1068.25 MHz. After the AFC loop synchronization, the frequency converter 1 can produce a signal with a stable frequency fIF, without depending on the accuracy in the offset voltage VOFS of the voltage source 8.

In this case, in accordance with the formula (4), the noise level of the local oscillator 2 is expressed as follows:

$$PNout = [-140 + 20 \times \log(213)] \text{ dBc/Hz}$$
$$= -93.4 \text{ dBc/Hz}$$

This corresponds to the noise level improved by about 26 dB, comparing the configuration shown in FIG. 17.

According to the first embodiment, the step of the local oscillator 2 can be determined only by a condition necessary for the transponder selection, without depending on the absolute frequency requirement, and the frequency division number of the frequency divider 24 in the local oscillator 2 can be reduced by increasing the comparison frequency fR. Hence, the noise level affecting largely the quality of the communications line can be suppressed to a small value. This feature contributes largely improving the performance of the AFC circuit.

Figure 7:
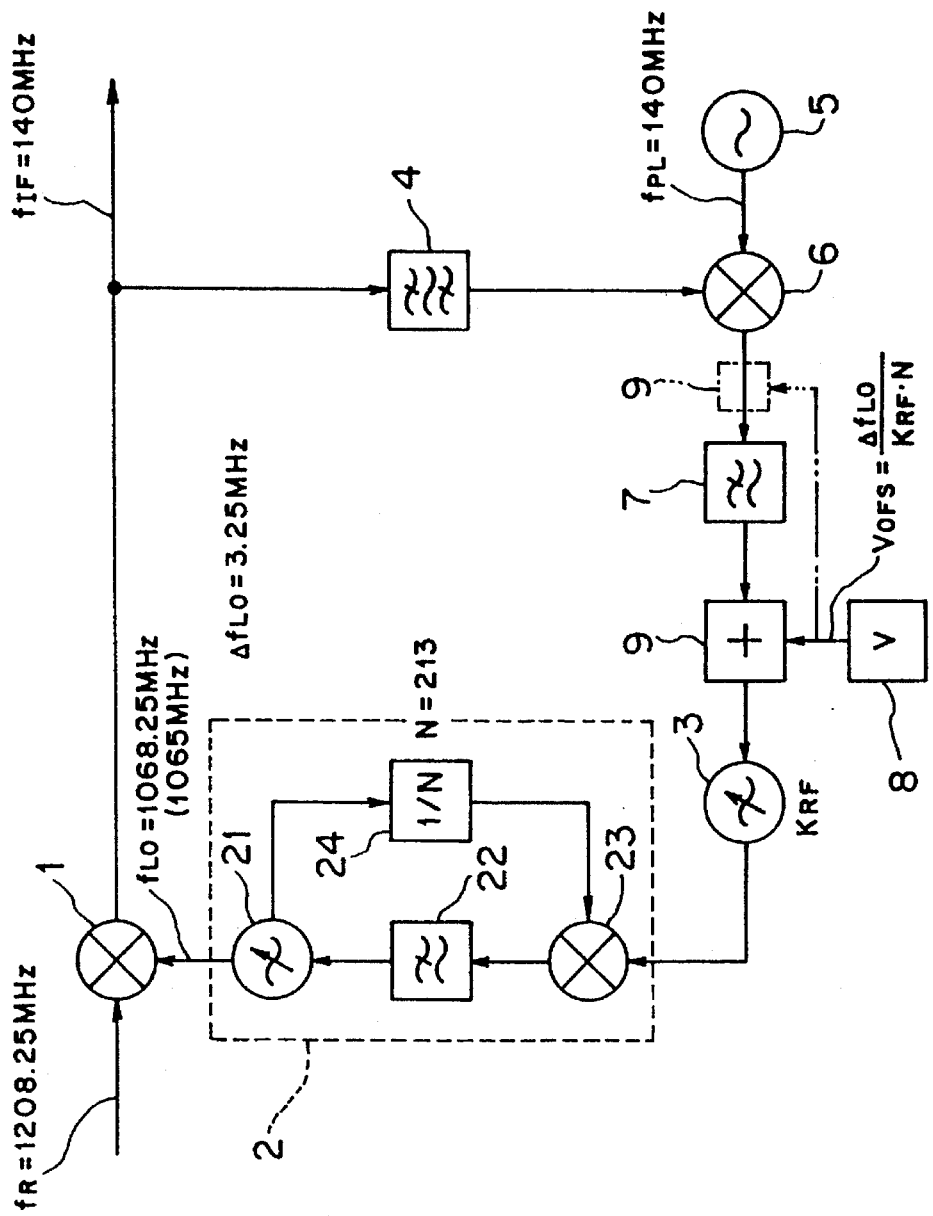
FIG. 7 is a block diagram showing a modification of the first embodiment according to the present invention.

Explanation has been made as for the first embodiment including the frequency divider arranged between the local oscillator 2 and the voltage controlled oscillator 3. The frequency divider 10 can be omitted as shown in FIG. 7. In this case, setting the oscillation frequency fREF of the voltage controlled oscillator 3 to 5 MHz enables the function and effect similar to those the embodiment described above. In the case of M=1, the following formula (6) can be substituted for the formula (5):

VOFS= ΔfLO/(KRF.N)    (6)

Figure 8:
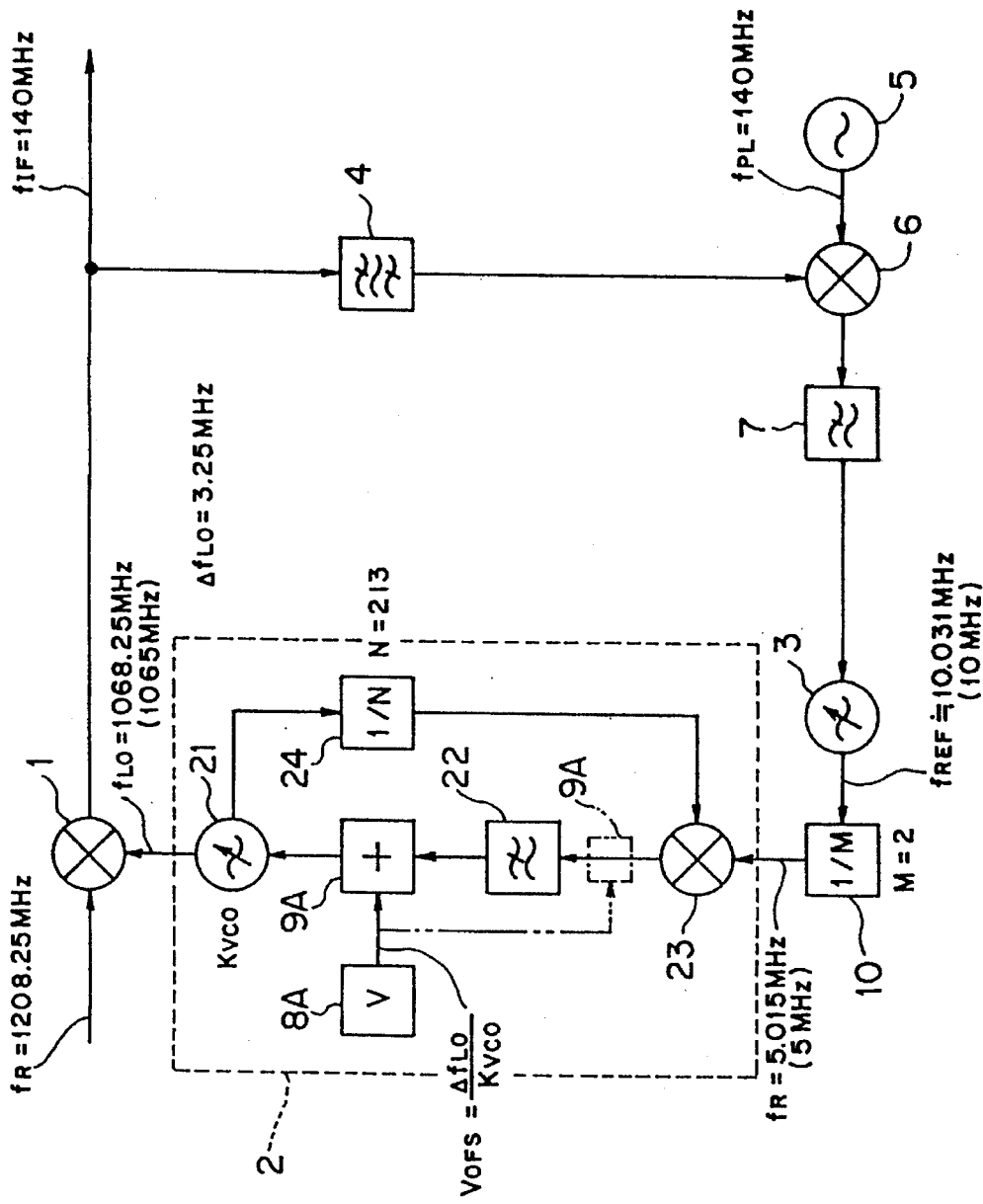
FIG. 8 is a block diagram showing the second embodiment according to the present invention.

(c) Explanation of Second Embodiment:

FIG. 8 is a block diagram showing the aspect of the second embodiment according to the present invention. As shown in FIG. 8, the automatic frequency control circuit resembles the configuration of the first embodiment. According to the second embodiment, the local oscillator 2 includes the voltage source 8A and the adder 9A, instead of the voltage source 8 and the adder 9 in the first embodiment.

In the second embodiment, the local oscillator 2 includes the voltage source 8A for producing a desired voltage to offset the oscillation frequency of the local oscillator 2 and the adder 9A for adding the output from the voltage source 8A to the oscillation frequency control signal of the local oscillator 2 (or a control voltage to the voltage controlled oscillator 21).

The adder 9A is arranged between the voltage controlled oscillator 21 and the loop filter 22 to add the output from the loop filter 22 to the output from the voltage source 8A. The adder 9a, as shown with the chain double-dashed line in FIG. 8, may be arranged between the phase comparator 23 and the loop filter 22 to add the output from the phase comparator 23 to the output from the voltage source 8.

The voltage VOFS from the voltage source 8A is expressed by the following formula (7):

$$VOFS = \Delta fLO/(KR F \cdot N) \quad (7)$$

where $\Delta fLO$ is a difference between the frequency of a local signal from the local oscillator 2, the local signal being originally needed as a local signal for a frequency conversion to the frequency converter 1, and the frequency of a local signal outputted from the local oscillator 2 in response to the first reference signal with an oscillation frequency from the voltage controlled oscillator 3, and KVCO is the control sensitivity (modulation sensitivity) of the local oscillator 2.

The function and effect similar to those in the first embodiment can be obtained by applying the voltage VOFS to a control voltage to the voltage controlled oscillator 21 in the local oscillator 2.

Figure 9:
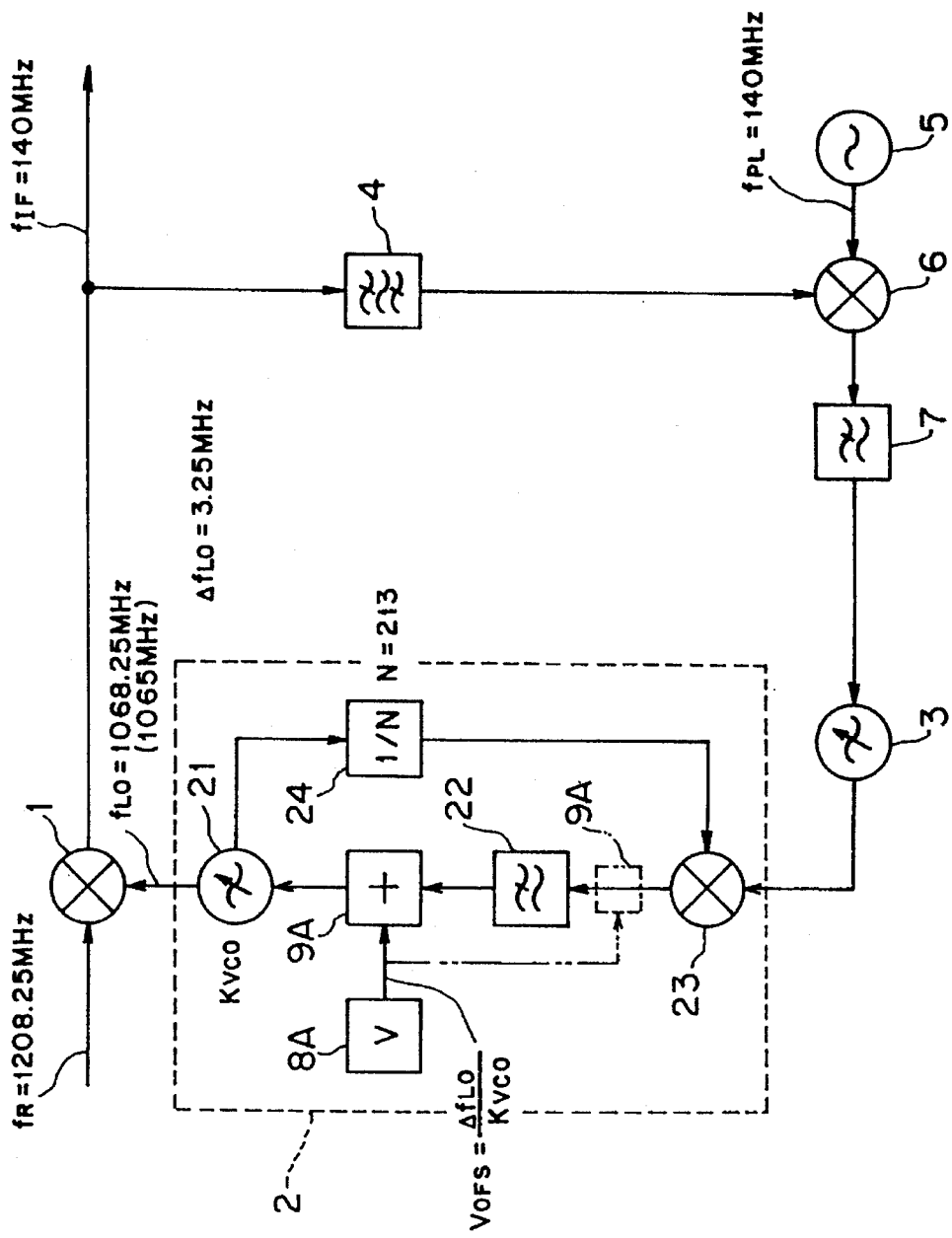
FIG. 9 is a block diagram showing a modification of the second embodiment according to the present invention.

In the second embodiment, explanation has been made as for the frequency divider arranged between the local oscillator and the voltage controlled oscillator 3. However, the frequency divider 10 can be omitted as shown in FIG. 9. In this case, with the oscillation frequency fREF of the voltage controlled oscillator 3 at 5 MHz and an application of the formula (6), the function and effect similar to those of the embodiment described above can be obtained.

Figure 10:
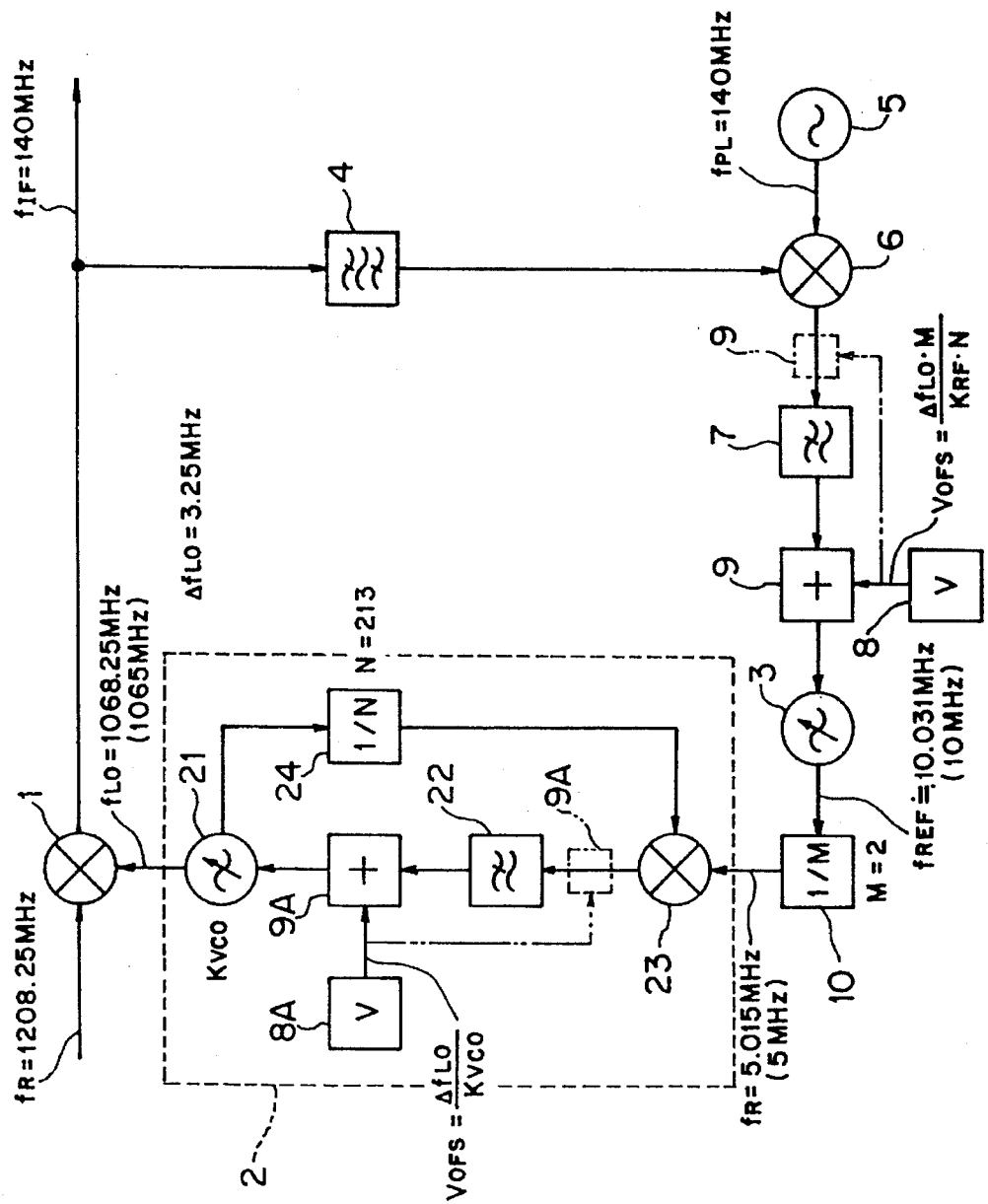
FIG. 10 is a block diagram showing the third embodiment according to the present invention.

(d) Explanation of Third Embodiment:

FIG. 10 is a block diagram showing the third embodiment according to the present invention. As shown in FIG. 10, the automatic frequency control circuit of the third embodiment has a configuration similar to those of the first and second embodiments. In the third embodiment, the automatic frequency control circuit includes the voltage source 8 and the adder 9 shown in the first embodiment as well as the voltage source 8A and the adder 9A shown in the second embodiment.

The first voltage source 8 and the first adder 9 are arranged to offset the oscillation frequency of the voltage controlled oscillator 3. The first voltage source 8 produces a desired voltage. The first adder 9 is arranged between the voltage controlled oscillator 3 and the loop filter 7 to add the output from the loop filter 7 to the output from the voltage source 8. The first adder 9, as shown with the chain double-dashed line in FIG. 10, may be arranged between the phase comparator 6 and the loop filter 7 to add the output from the phase comparator to the output from the voltage source 8.

In order to offset the oscillation frequency, the local oscillator 2 includes the second voltage source 8A for producing a desired voltage and the second adder 9A for adding the output from the second voltage source 8A to the oscillation frequency control signal of the local oscillator 2 (or the control voltage to the voltage controlled oscillator 21). The second adder 9A is arranged between the voltage controlled oscillator 21 and the loop filter 22 to add the output from the loop filter 22 to the output from the second voltage source 8A. The second adder 9A, as shown with the chain double-dashed line in FIG. 10, may be arranged between the phase comparator 23 and the loop filter 22 to add the output from the phase comparator 23 to the output from the second voltage source 8.

The offset voltage VOFS is applied to the first voltage source 8 in accordance with the formula (5) and to the second voltage source 8A in accordance with the formula (7).

The third embodiment according to the present invention can provide the function and effect similar to those in the first embodiment. In the third embodiment, the coarse frequency adjustment is performed by using the second voltage source 8A and the second adder 9A while the fine frequency adjustment can be performed by using the first voltage source 8 and the first adder 9. Thus, the oscillation frequency fLO of the local oscillator 2, or the shift in the conversion frequency fIF of the frequency converter 1, can be adjusted with high accuracy.

Figure 11:
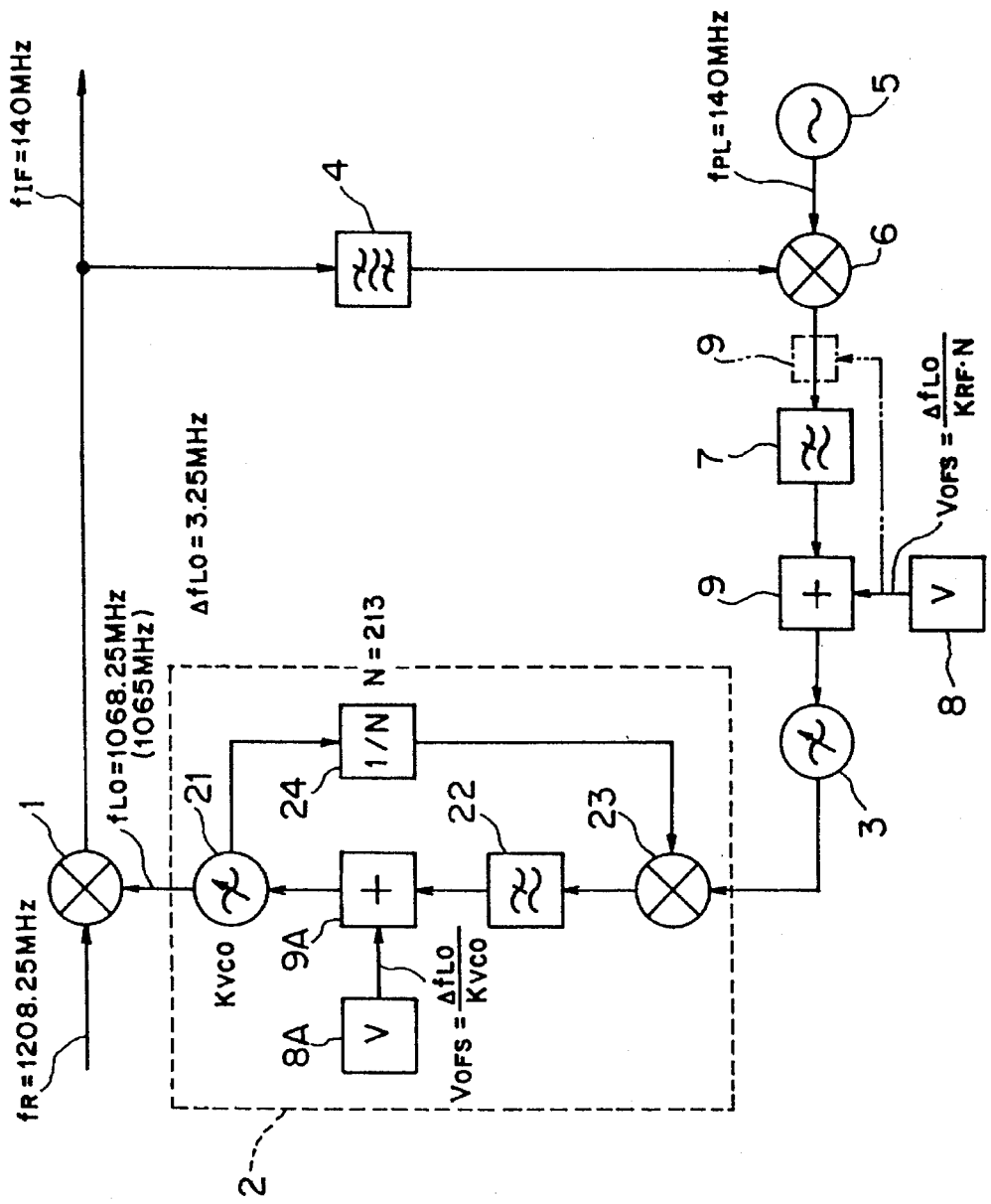
FIG. 11 is a block diagram showing a modification of the third embodiment according to the present invention.

In the third embodiment, the frequency divider 10 is arranged between the local oscillator 2 and the voltage controlled oscillator 3. However, the frequency divider 10 may be omitted here as shown in FIG. 11. In this case, with the oscillation frequency fREF of the voltage controlled oscillator 3 at 5 MHz and the use of the formula (6), the function and effect similar to those in the third embodiment can be obtained.

Figure 12:
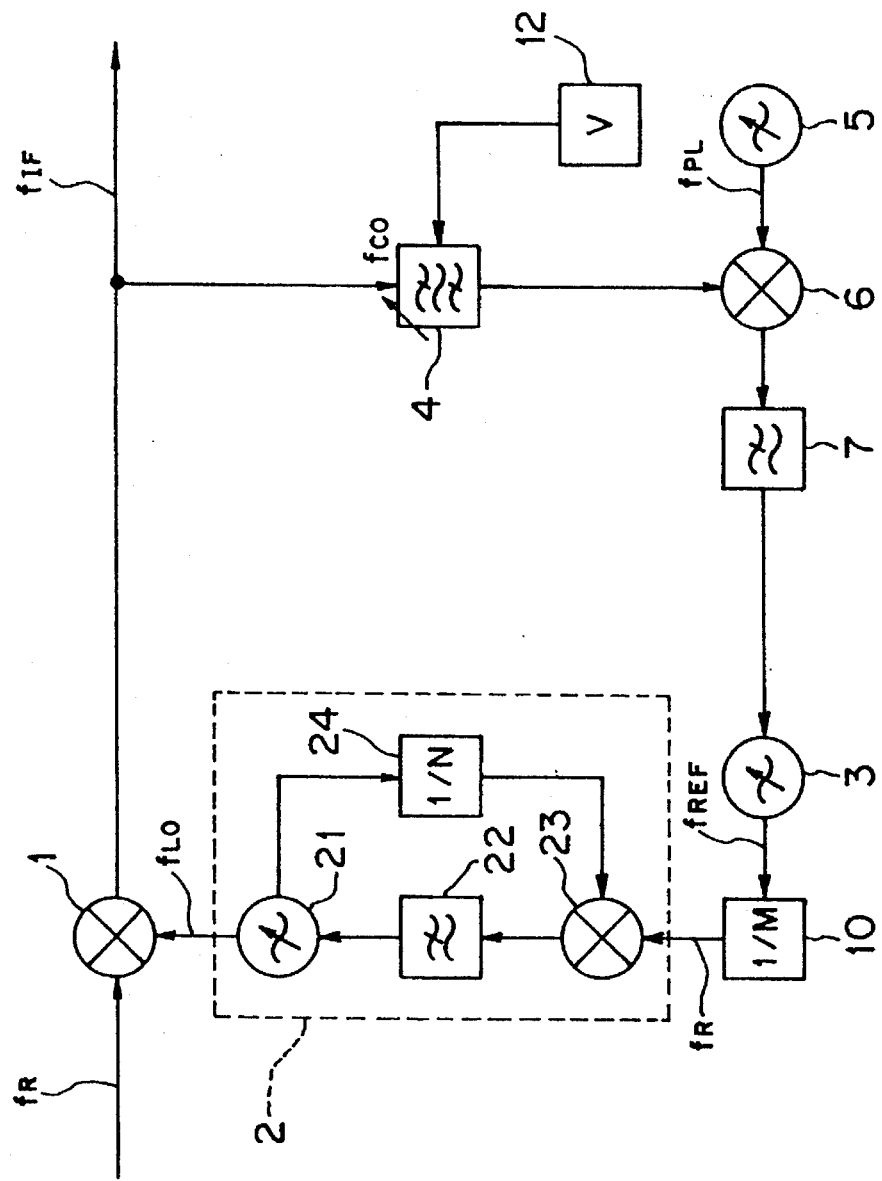
FIG. 12 is a block diagram showing the fourth embodiment according to the present invention.

(e) Explanation of Fourth Embodiment:

FIG. 12 is a block diagram showing the fourth embodiment according to the present invention. As shown in FIG. 12, the automatic frequency control circuit of the fourth embodiment has substantially the same configuration as those in the first to third embodiments. In the fourth embodiment, the voltage source 12 acting as a frequency offset controller to control the offset of the center frequency fCO of the bandpass filter 4 is arranged, instead of the voltage sources 8 and 8A and the adders 9 and 9A.

According to the present embodiment, the bandpass filter 4 can control the offset of its center frequency fCO when the voltage source 12 applies a desired voltage thereto. According to the present embodiment, a digital-type PFD that has a wide frequency detection sensitivity and less frequency dependency is used as the phase comparator 6.

In the fourth embodiment, the offset of the center frequency fCO of the bandpass filter 4 can be varied externally. That is, with a high comparison frequency fR to the local oscillator 2 and a small frequency division number N of the frequency divider 24, the frequency difference $\Delta fLO$ occurs between a desired local frequency and a local frequency actually obtained. However, the frequency difference $\Delta fLO$ also occurs between the desired frequency and the frequency fIF converted by the frequency converter 1.

According to the present embodiment, the voltage source 12 applies a suitable voltage to the bandpass filter 4 to offset the center frequency fCO of the bandpass filter 4 by the frequency difference $\Delta fLO$. As a result, the AFC loop is locked with the state shifted by the frequency difference $\Delta fLO$ from the desired frequency.

According to the fourth embodiment, the frequency fIF converted by the frequency converter 1 can be shifted only by controlling the offset of the center frequency fco of the bandpass filter 4, without controlling the oscillation frequency of the reference oscillator 5. Thus, the function and effect similar to those in the first embodiment can be obtained.

In the fourth embodiment, the frequency divider 10 is arranged between the local oscillator 2 and the voltage controlled oscillator 3. However, the frequency divider 10 can be omitted.

Figure 13:
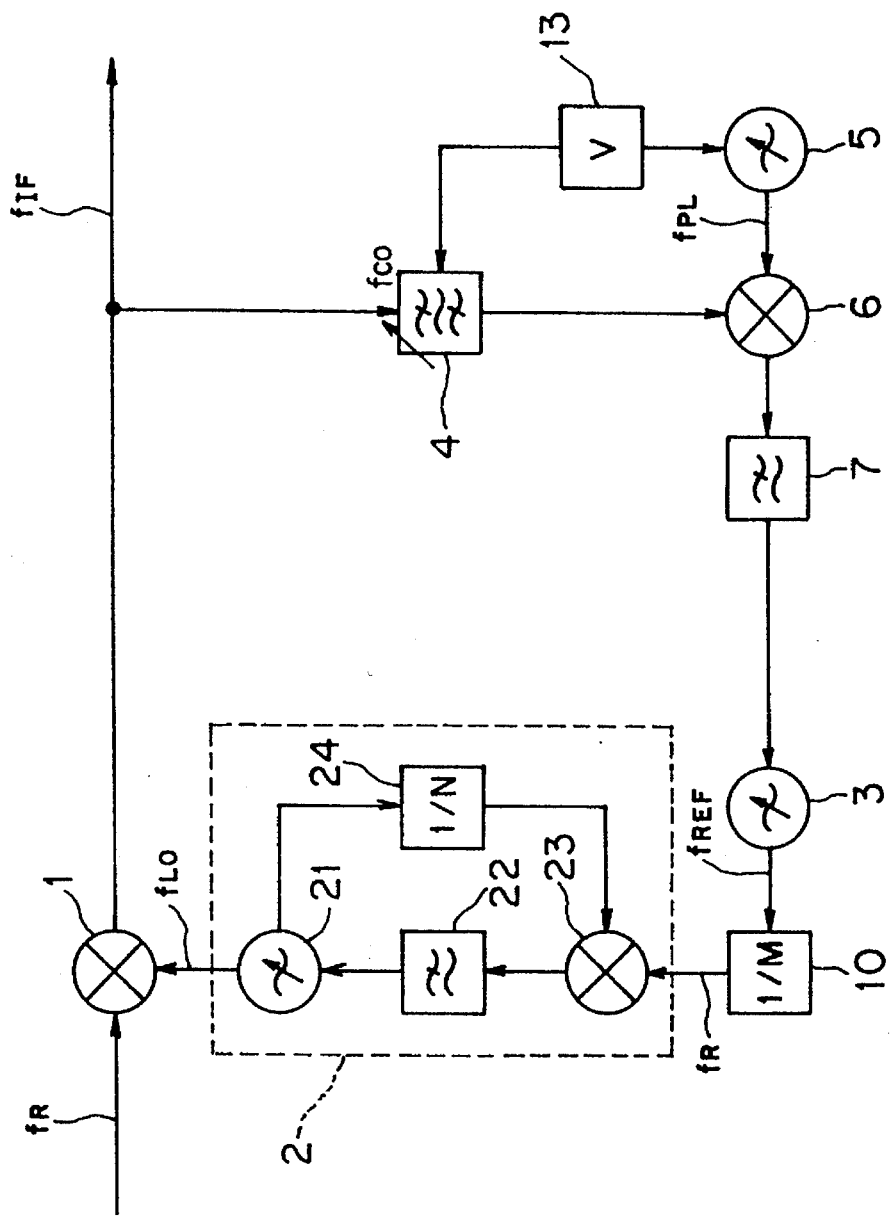
FIG. 13 is a block diagram showing the fifth embodiment according to the present invention.

(f) Explanation of Fifth Embodiment:

FIG. 13 is a block diagram showing the fifth embodiment according to the present invention. As shown in FIG. 13, the automatic frequency control circuit according to the fifth embodiment has the configuration similar to that of the fourth embodiment. In the fifth embodiment, the voltage source 13 acting as a frequency offset controller that controls the offset of the center frequency fCO of the bandpass filter 4 and the offset of the oscillation frequency fPL of the reference oscillator 5 is arranged, instead of the voltage source 12 shown in FIG. 12.

The bandpass filter 4 according to the present embodiment offsets its center frequency fCO. When the voltage source 13 applies a desired voltage to the bandpass filter 4, the offset of the center frequency fCO is controlled. The offset of the oscillation frequency fPL of the reference oscillator 5 can be adjusted by varying the control voltage from the voltage source 13.

In the fifth embodiment, the offset of the center frequency fCO of the bandpass filter 4 as well as the offset of the oscillation frequency fPL of the reference oscillator 5 can be varied externally.

As described above, with the high comparison frequency fR to the local oscillator 2 and the small frequency division number of the frequency divider 24 in the local oscillator 2, a frequency difference $\Delta$fLO occurs between a desired frequency and a frequency actually obtained. However, the frequency difference $\Delta$fLO occurs between a desired frequency and a frequency fIF converted by the frequency converter 1.

In the present embodiment, the voltage source 13 applies a suitable voltage to the bandpass filter 4 to offset the center frequency fCO of the bandpass filter 4 and the oscillation frequency fPL of the reference oscillator 5 by the frequency difference $\Delta$fLO. As a result, the AFC loop is locked with the frequency difference $\Delta$fLO shifted from the desired frequency.

Thereafter, the AFC loop varies its frequency as the offset is reduced gradually. Finally, when the offset is completely removed and the oscillation frequency fPL of the reference oscillator 5 is 140 MHz, the frequency fIF converted by the frequency converter 1 becomes a desired frequency.

According to the fifth embodiment, without using a phase comparator 6 with less frequency dependency, the frequency fLO of the local signal from the local oscillator 2, or the frequency fIF converted by the frequency converter 1, can be shifted to a desired frequency. Hence, the function and effect similar to those of the first embodiment can be obtained.

Figure 14:
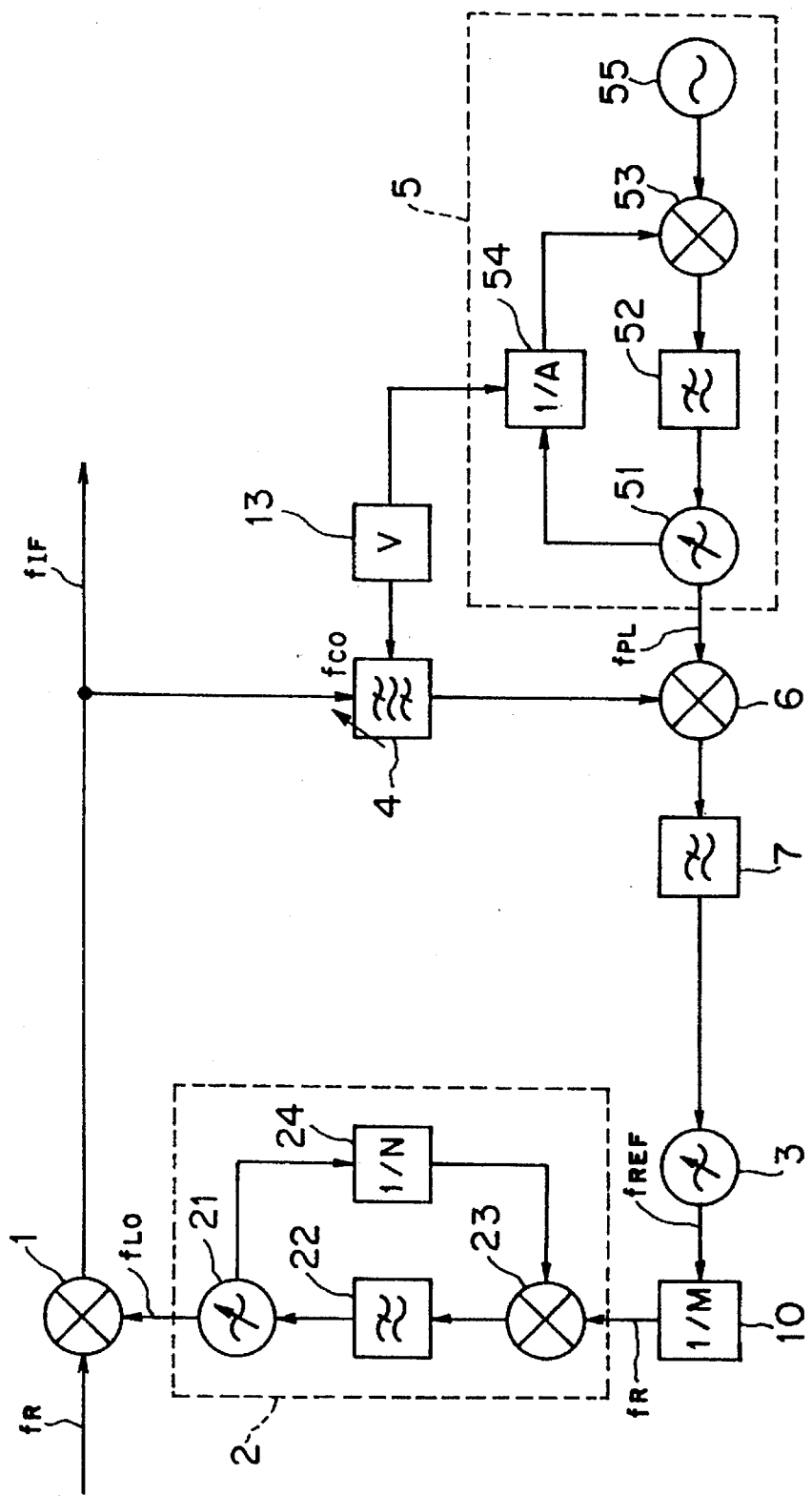
FIG. 14 is a block diagram showing the fifth embodiment of the present invention.
Figure 15:
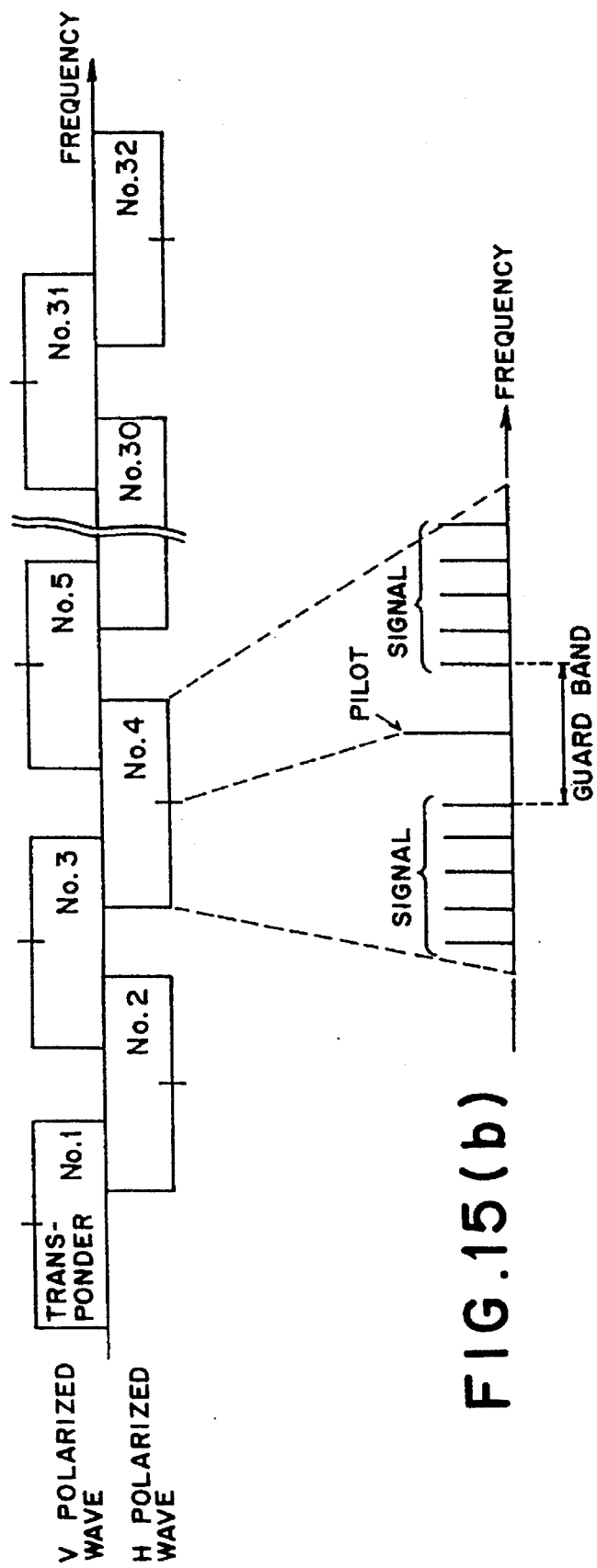
FIG. 15(a) is a block diagram showing frequency bands to which transponders in a satellite link are allocated, respectively.
FIG. 15(b) is a block diagram showing the frequency spectrum of channels arranged for each transponder.
Figure 16:
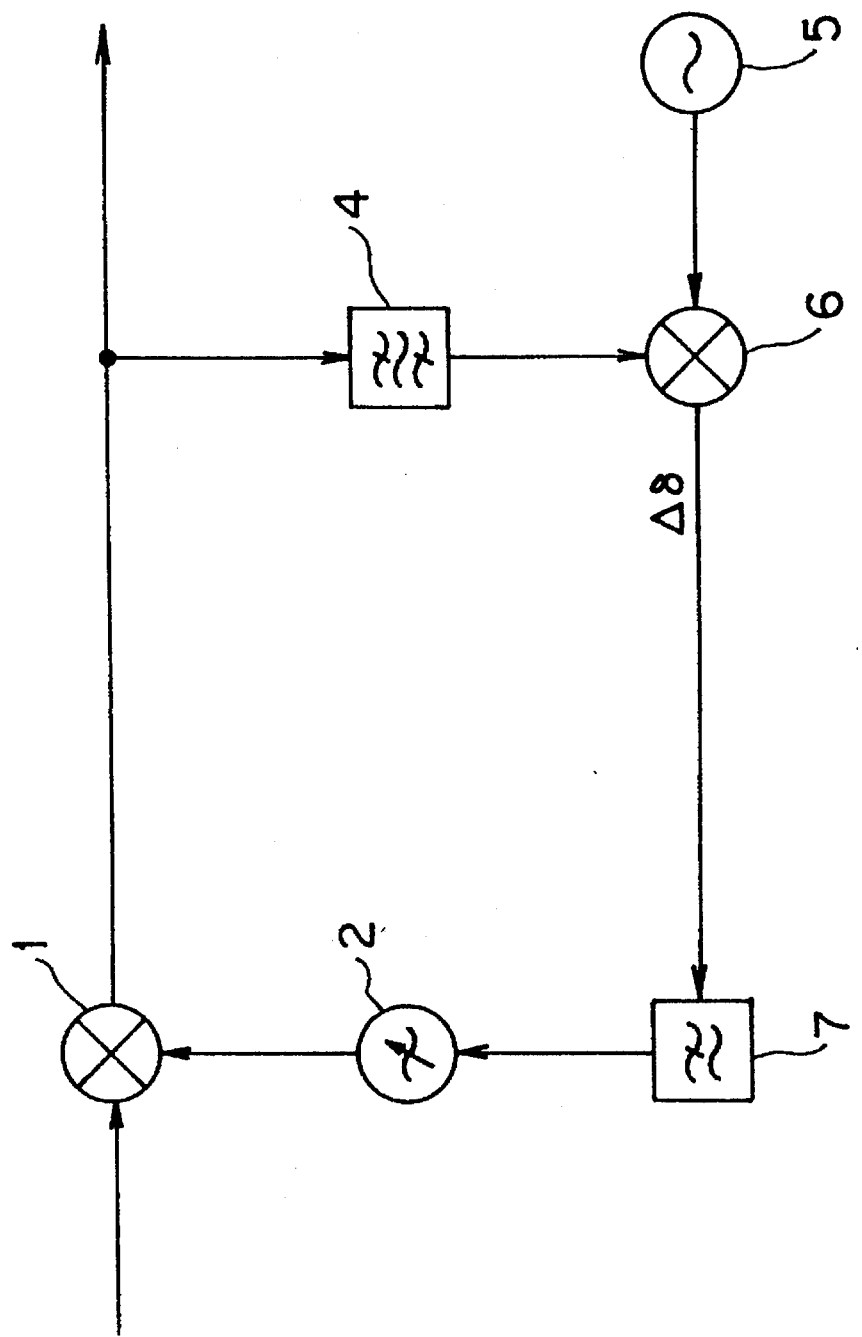
FIG. 16 is a block diagram used for explaining the theory of an AFC.

The PLL oscillator structure, as shown in FIG. 14, can be used as the reference oscillator 5. The PLL reference oscillator 5 includes the voltage controlled oscillator 51, the loop filter 52, the phase comparator 53, the frequency divider 54 with frequency division number A, and the reference oscillator 55. The voltage source 13 applies a voltage to the frequency divider 54 to vary the frequency division number A of the frequency divider 54, whereby the offset of the oscillation frequency fPL of the reference oscillator 5 can be varied externally. In this case, the function and effect similar to those in the fifth embodiment can be obtained.

In the fifth embodiment, the frequency divider 10 is arranged between the local oscillator 2 and the voltage controlled oscillator 3. However, the frequency divider 10 may be omitted.

What is claimed is:

1. An automatic frequency control circuit comprising:
    a frequency converter for converting an input signal into a signal with a desired frequency;
    a local oscillator having a synthesizer configuration for supplying a local signal for a frequency conversion to said frequency converter;
    a voltage controlled oscillator for supplying a first reference signal to said local oscillator;
    a bandpass filter for passing a signal with a desired frequency among signals converted by said frequency converter;
    a reference oscillator for supplying a second reference signal being a reference signal to synchronize said input signal to a fixed frequency;
    a phase comparator for comparing the output from said reference oscillator with the output from said bandpass filter;
    a loop filter for smoothing the output from said phase comparator to output the smoothed voltage as a control voltage to said voltage controlled oscillator; and
    a voltage source for producing a desired voltage and an adder for adding the output from said voltage source to a signal from a circuit portion ranging from said phase comparator to said voltage controlled oscillator, to offset an oscillation frequency of said first reference signal from said voltage controlled oscillator.

2. An automatic frequency control circuit according to claim 1, wherein said adder is arranged between said voltage controlled oscillator and said loop filter.

3. An automatic frequency control circuit according to claim 1, wherein said adder is arranged between said phase comparator and said loop filter.

4. An automatic frequency control circuit according to claim 1, wherein a voltage outputted from said voltage source is set to a value of:

$$\Delta fLO/KRF.N$$

where $\Delta$fLO is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator, KRF is a control voltage sensitivity of said voltage controlled oscillator, and N is a frequency division number of said local oscillator.

5. An automatic frequency control circuit according to claim 1, wherein said adder is arranged between said voltage controlled oscillator and said loop filter and wherein a voltage outputted from said voltage source is set to a value of:

$$\Delta fLO/KRF.N$$

where $\Delta$fLO is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator, KRF is a control voltage sensitivity of said voltage controlled oscillator, and N is a frequency division number of said local oscillator.

6. An automatic frequency control circuit according to claim 1, wherein said adder is arranged between said phase comparator and said loop filter and wherein a voltage outputted from said voltage source is set based on a value of:

ΔfLO / KRF.N where ΔfLO is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator, and KRF is a control voltage sensitivity of said voltage controlled oscillator, and N is a frequency division number of said local oscillator.

7. An automatic frequency control circuit, according to claim 1, further comprising a frequency divider arranged between said local oscillator and said voltage controlled oscillator.

8. An automatic frequency control circuit, according to claim 2, further comprising a frequency divider arranged between said local oscillator and said voltage controlled oscillator.

9. An automatic frequency control circuit, according to claim 3, further comprising a frequency divider arranged between said local oscillator and said voltage controlled oscillator.

10. An automatic frequency control circuit according to claim 1, further comprising a frequency divider arranged between said local oscillator and said voltage controlled oscillator, and wherein a voltage outputted from said voltage source is set based on a value of:

(ΔfLO.M)/(KRF.N)

where ΔfLO is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator via said frequency divider, M is a frequency division number of said frequency divider, KRF is a control voltage sensitivity of said voltage controlled oscillator, and N is a frequency division number of said local oscillator.

11. An automatic frequency control circuit according to claim 1, further comprising a frequency divider arranged between said local oscillator and said voltage controlled oscillator, and wherein said adder is arranged between said voltage controlled oscillator and said loop filter, and wherein a voltage outputted from said voltage source is set based on a value of:

(ΔfLO.M)/(KRF.N)

where ΔfLO is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator via said frequency divider, M is a frequency division number of said frequency divider, KRF is a control voltage sensitivity of said voltage controlled oscillator, and N is a frequency division number of said local oscillator.

12. An automatic frequency control circuit according to claim 1, further comprising a frequency divider arranged between said local oscillator and said voltage controlled oscillator, and wherein said adder is arranged between said phase comparator and said loop filter, and wherein a voltage outputted from said voltage source is set based on a value of:

(ΔfLO.M)/(KRF.N)

where ΔfLO is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator via said frequency divider, M is a frequency division number of said frequency divider, KRF is a control voltage sensitivity of said voltage controlled oscillator, and N is a frequency division number of said local oscillator.

13. An automatic frequency control circuit comprising:

a frequency converter for converting an input signal into a signal with a desired frequency;

a local oscillator having a synthesizer configuration for supplying a local signal for a frequency conversion to said frequency converter;

a voltage controlled oscillator for supplying a first reference signal to said local oscillator;

a bandpass filter for passing a signal with a desired frequency among signals converted by the frequency converter;

a reference oscillator for supplying a second reference signal being a reference signal to synchronize said input signal to a fixed frequency;

a phase comparator for comparing the output from said reference oscillator with the output from said bandpass filter;

a loop filter for smoothing the output from said phase comparator to output the smoothed voltage as a control voltage to said voltage controlled oscillator; and a voltage source for producing a desired voltage and an adder for adding the output from said voltage source to an oscillation frequency control signal of said local signal oscillator, to offset an oscillation frequency of said local oscillator.

14. An automatic frequency control circuit according to claim 13, wherein a voltage outputted from said voltage source is set to a value of:

ΔfLO/Kvco where ΔfLO is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator, and Kvco is a control voltage sensitivity of said local oscillator.

15. An automatic frequency control circuit comprising:

a frequency converter for converting an input signal into a signal with a desired frequency;

a local oscillator having a synthesizer configuration for supplying a local signal for a frequency conversion to said frequency converter;

a voltage controlled oscillator for supplying a first reference signal to said local oscillator;

a bandpass filter for passing a signal with a desired frequency among signals converted by the frequency converter;

a reference oscillator for supplying a second reference signal being a reference signal to synchronize said input signal to a fixed frequency;

a phase comparator for comparing the output from said reference oscillator with the output from said bandpass filter;

a loop filter for smoothing the output from said phase comparator to output the smoothed voltage as a control voltage to said voltage controlled oscillator;

a first voltage source for producing a desired voltage to offset the oscillation frequency of said voltage controlled oscillator;

an adder for adding the output from said first voltage source to a signal of a circuit portion ranging from said phase comparator to said voltage controlled oscillator; and a second voltage source for providing a desired voltage and a second adder for adding the output from said second voltage source to an oscillation control signal of said local oscillator, to offset the oscillation frequency of said local oscillator.

16. An automatic frequency control circuit according to claim 15, wherein said first adder is arranged between said voltage controlled oscillator and said loop filter.

17. An automatic frequency control circuit according to claim 15, wherein said first adder is arranged between said phase comparator and said loop filter.

18. An automatic frequency control circuit according to claim 15, wherein a voltage outputted from said first voltage source is set to a value of:

$$\Delta fLO/(KRF.N)$$

where $\Delta fLO$ is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator, KRF is a control voltage sensitivity of said voltage controlled oscillator, and N is a frequency division number of said local oscillator, and wherein a voltage from said second voltage source is set based on a value of:

$$\Delta fLO/Kvco$$

where $\Delta fLO$ is the difference frequency and Kvco is a control sensitivity of said local oscillator.

19. An automatic frequency control circuit according to claim 15, wherein said first adder is arranged between said voltage controlled oscillator and said loop filter, and wherein a voltage outputted from said first voltage source is set to a value of:

$$\Delta fLO/(KRF.N)$$

where $\Delta fLO$ is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator, KRF is a control voltage sensitivity of said voltage controlled oscillator, and N is a frequency division number of said local oscillator, and wherein a voltage from said second voltage source is set based on a value of:

$$\Delta fLO/Kvco$$

where $\Delta fLO$ is the difference frequency and Kvco is a control sensitivity of said local oscillator.

20. An automatic frequency control circuit according to claim 15, wherein said first adder is arranged between said phase comparator and said loop filter, and wherein a voltage outputted from said first voltage source is set to a value of:

$$\Delta fLO/(KRF.N)$$

where $\Delta fLO$ is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator, KRF is a control voltage sensitivity of said voltage controlled oscillator, and N is a frequency division number of said local oscillator, and wherein a voltage from said second voltage source is set based on a value of:

$$\Delta fLO/Kvco$$

where $\Delta fLO$ is the difference frequency and Kvco is a control sensitivity of said local oscillator.

21. An automatic frequency control circuit, according to claim 15, further comprising a frequency divider arranged between said local oscillator and said voltage controlled oscillator.

22. An automatic frequency control circuit, according to claim 16, further comprising a frequency divider arranged between said local oscillator and said voltage controlled oscillator.

23. An automatic frequency control circuit, according to claim 17, further comprising a frequency divider arranged between said local oscillator and said voltage controlled oscillator.

24. An automatic frequency control circuit according to claim 15, further comprising a frequency divider arranged between said local oscillator and said voltage controlled oscillator, and wherein a voltage outputted from said first voltage source is set based on a value of:

$$(\Delta fLO.M)/(KRF.N)$$

where $\Delta fLO$ is a difference between the frequency of a local signal from said local oscillator, said local signal being needed originally as a local signal for a frequency conversion to said frequency converter, and the frequency of a local signal outputted from said local oscillator in response to the oscillation frequency of said first signal from said voltage controlled oscillator, M is a frequency division number of said frequency divider, KRF is a control voltage sensitivity of said voltage controlled oscillator, and N is a frequency division number in said local oscillator, and wherein a voltage from said second voltage source is set based on a value of:

$$\Delta fLO/Kvco$$

where $\Delta fLO$ is the difference frequency and Kvco is a control sensitivity of said local oscillator.

25. An automatic frequency control circuit according to claim 15, further comprising a frequency divider arranged between said local oscillator and said voltage controlled oscillator, and wherein said first adder is arranged between said voltage controlled oscillator and said loop filter, and wherein a voltage outputted from said first voltage source is set based on a value of:

$$(\Delta fLO.M)/(KRF.N)$$

where ΔfLO is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator, M is a frequency division number of said frequency divider, KRF is a control voltage sensitivity of said voltage controlled oscillator, and N is a frequency division number of said local oscillator, and wherein a voltage from said second voltage source is set based on a value of:

ΔfLO/Kvco where ΔfLO is the difference frequency and Kvco is a control sensitivity of said local oscillator.

26. An automatic frequency control circuit according to claim 15, further comprising a frequency divider arranged between said local oscillator and said voltage controlled oscillator, and wherein said first adder is arranged between said phase comparator and said loop filter, and wherein a voltage outputted from said first voltage source is set based on a value of:

(ΔfLO.M)/(KRF.N)

where ΔfLO is a difference between the frequency of a local signal from said local oscillator, said local signal being needed originally as a local signal for a frequency conversion to said frequency converter, and the frequency of a local signal outputted from said local oscillator in response to the oscillation frequency of said first reference signal from said voltage controlled oscillator, M is a frequency division number of said frequency divider, KRF is a control voltage sensitivity of said voltage controlled oscillator, and N is a frequency division number of said local oscillator, and wherein a voltage from said second voltage source is set based on a value of:

ΔfLO/Kvco where ΔfLO is the difference frequency and Kvco is a control sensitivity of said local oscillator.

27. An automatic frequency control circuit comprising:
a frequency converter for converting an input signal into a signal with a desired frequency;
a local oscillator having a synthesizer configuration for supplying a local signal for a frequency conversion to said frequency converter;
a voltage controlled oscillator for supplying a first reference signal to said local oscillator;
a bandpass filter for passing a signal with a desired frequency among signals converted by the frequency converter;
a reference oscillator for supplying a second reference signal being a reference signal to synchronize said input signal to a fixed frequency;
a phase comparator for comparing the output from said reference oscillator with the output from said bandpass filter;
a loop filter for smoothing the output from said phase comparator to output the smoothed voltage as a control voltage to said voltage controlled oscillator; and
a frequency offset control unit for controlling an offset of the center frequency of said bandpass filter to offset the center frequency of said bandpass filter.

28. An automatic frequency control circuit according to claim 27, wherein said phase comparator comprises a phase comparator with less frequency dependency.

29. An automatic frequency control circuit comprising:
a frequency converter for converting an input signal into a signal with a desired frequency;
a local oscillator having a synthesizer configuration for supplying a local signal for a frequency conversion to said frequency converter;
a voltage controlled oscillator for supplying a first reference signal to said local oscillator;
a bandpass filter for passing a signal with a desired frequency among signals converted by the frequency converter;
a reference oscillator for supplying a second reference signal being a reference signal to synchronize said input signal to a fixed frequency;
a phase comparator for comparing the output from said reference oscillator with the output from said bandpass filter;
a loop filter for smoothing the output from said phase comparator to output the smoothed voltage as a control voltage to said voltage controlled oscillator; and
a frequency offset control unit for controlling both an offset of the center frequency of said bandpass filter and an offset of the frequency of said reference oscillator, to offset the center frequency of said bandpass filter.

* * * * *